United States Patent
Ando et al.

(10) Patent No.: US 10,778,183 B2
(45) Date of Patent: Sep. 15, 2020

(54) SAW-BASED ELECTRONIC ELEMENTS AND FILTER DEVICES

(71) Applicant: SKYWORKS FILTER SOLUTIONS JAPAN CO., LTD., Kadoma-Shi (JP)

(72) Inventors: Yoshiaki Ando, Yokosuka (JP); Satoshi Niwa, Taito-Ku (JP); Hiroyuki Nakamura, Osaka-Fu (JP)

(73) Assignee: SKYWORKS FILTER SOLUTIONS JAPAN CO., LTD., Kadoma-Shi (JP)

( * ) Notice: Subject to any disclaimer, the term of this patent is extended or adjusted under 35 U.S.C. 154(b) by 521 days.

(21) Appl. No.: 15/651,216

(22) Filed: Jul. 17, 2017

(65) Prior Publication Data

US 2018/0019727 A1  Jan. 18, 2018

Related U.S. Application Data

(60) Provisional application No. 62/510,035, filed on May 23, 2017, provisional application No. 62/363,655, filed on Jul. 18, 2016.

(51) Int. Cl.
*H03H 9/15* (2006.01)
*H03H 9/10* (2006.01)
(Continued)

(52) U.S. Cl.
CPC ............ *H03H 9/15* (2013.01); *H01L 41/053* (2013.01); *H03H 9/02818* (2013.01);
(Continued)

(58) Field of Classification Search
CPC .. H03H 9/15; H03H 9/02818; H03H 9/02913; H03H 9/0576; H03H 9/1071; H03H 9/6483; H01L 41/053
(Continued)

(56) References Cited

U.S. PATENT DOCUMENTS 6,417,574 B1 *  7/2002  Misawa ............... H03H 9/059
                                                   257/737
2004/0075513 A1  4/2004  Ikeda et al.
(Continued)

FOREIGN PATENT DOCUMENTS

| JP | H06244676 A | 9/1994 |
|---|---|---|
| JP | 2008-288497 A | 11/2008 |
| JP | 2014-143640 A | 8/2014 |

OTHER PUBLICATIONS

International Search Report and Written Opinion from corresponding International Application No. PCT/JP2017/025889 dated Oct. 4, 2017.

*Primary Examiner* — Benny T Lee
*Assistant Examiner* — Hafizur Rahman
(74) *Attorney, Agent, or Firm* — Lando & Anastasi, LLP

(57) ABSTRACT

Aspects and examples provide electronic elements and filter devices configured to prevent deterioration of the propagation characteristics caused by input and output signals being electromagnetically coupled to an electric conductor side wall. In one example an electronic filter includes an element substrate having a top surface, a bottom surface, a side surface, and piezoelectric body. A circuit including a plurality of SAW resonators is formed on the top surface of the element substrate. The electronic filter further includes a sealing substrate having a top surface and a bottom surface, and a side wall including an electric conductor and formed to define a cavity between the top surface of the element substrate and the bottom surface of the sealing substrate, the side wall enclosing a periphery of the circuit and being connected to a ground potential of the circuit.

22 Claims, 17 Drawing Sheets

(51) Int. Cl.
*H03H 9/02* (2006.01)
*H03H 9/05* (2006.01)
*H01L 41/053* (2006.01)
*H03H 9/64* (2006.01)

(52) U.S. Cl.
CPC ...... *H03H 9/02913* (2013.01); *H03H 9/0576* (2013.01); *H03H 9/1071* (2013.01); *H03H 9/6483* (2013.01)

(58) Field of Classification Search
USPC ........................................................ 333/193
See application file for complete search history.

(56) References Cited

U.S. PATENT DOCUMENTS

| | | |
|---|---|---|
| 2004/0232802 A1 | 11/2004 | Koshido |
| 2005/0116352 A1 | 6/2005 | Warashina et al. |
| 2005/0146397 A1* | 7/2005 | Koga ................ H03H 9/0576 333/133 |
| 2005/0242420 A1 | 11/2005 | Matsuda et al. |
| 2006/0022768 A1 | 2/2006 | Yokota et al. |
| 2007/0024391 A1 | 2/2007 | Sul et al. |
| 2007/0107177 A1 | 5/2007 | Kawachi et al. |
| 2011/0193650 A1 | 8/2011 | Takenoshita et al. |
| 2012/0049978 A1 | 3/2012 | Pang et al. |
| 2014/0111062 A1 | 4/2014 | Bauer et al. |
| 2014/0118094 A1 | 5/2014 | Matsuda |

\* cited by examiner

SAW-BASED ELECTRONIC ELEMENTS AND FILTER DEVICES

CROSS-REFERENCE TO RELATED APPLICATIONS

This application claims the benefit under 35 U.S.C. § 119(e) of U.S. Provisional Application Nos. 62/363,655, titled "ELECTRONIC ELEMENTS AND FILTER DEVICES," filed on Jul. 18, 2016, and 62/510,035, titled "SAW-BASED ELECTRONIC ELEMENTS AND FILTER DEVICES," filed on May 23, 2017, each of which is herein incorporated by reference in its entirety for all purposes.

BACKGROUND

Conventionally, technology for configuring an electronic component includes forming a micro-electro-mechanical element such as a surface acoustic wave (SAW) resonator on a top surface of an element substrate made of piezoelectric body, enclosing the element with a metallic spacer, and then sealing the element with a sealing substrate. Examples are disclosed in Japanese Patent Application Publication No. 2008-288497 and Japanese Patent Application Publication No. 2014-143640.

FIGS. 1A and 1B show a configuration example of a conventional electronic element in which SAW resonators form a filter. FIG. 1A is a plan view showing a SAW resonator disposed on a top surface 110a of an element substrate 110, and FIG. 1B is a cross-sectional view taken along line L-L of FIG. 1A. FIG. 1A corresponds to a cross-section taken along line P-P of FIG. 1B.

The conventional electronic element 100 includes a filter circuit having wirings 140 connecting a plurality of SAW resonators 131, 132, 133, 134, 135, 136, 137 formed on the top surface 110a of the element substrate 110 made of piezoelectric body. Each of the SAW resonators 131, 132, 133, 134, 135, 136, 137 includes an interdigital transducer (IDT) electrode disposed to be sandwiched between two reflector electrodes. Further, a side wall 170 made of an electric conductor such as metal is formed on the top surface 110a of the element substrate 110 to enclose the filter circuit along the outer periphery. A bottom surface 120b of a sealing substrate 120 is supported by the side wall 170 and defines a cavity together with the top surface 110a of the element substrate 110 and the side wall 170.

Columnar signal electrodes 151, 154 and ground electrodes 155, 156, 157 are connected respectively to signal pads 141, 144 and ground pads 145, 146, 147 formed on the top surface 110a of the element substrate 110 and pass through the sealing substrate 120 from the top surface 120a to the bottom surface 120b via through-holes 120c. External signal electrode pads 181 and external ground electrode pads 185 are formed on the top surface 120a of the sealing substrate 120. Each of the signal electrodes 151, 154 and each of the ground electrodes 155, 156, 157 are connected respectively to each of the external signal electrode pads 181 and each of the external ground electrode pads 185.

FIG. 2 shows a circuit diagram of the electronic element of FIGS. 1A and 1B. The electronic element 100 includes a ladder-type filter in which the SAW resonators 131, 132, 133, 134 are arranged as series resonators and the SAW resonators 135, 136, 137 are arranged as parallel resonators.

SUMMARY OF THE INVENTION

Aspects and embodiments relate to an electronic element configured to include a sealed surface acoustic wave resonator and the like, and to a filter device including the electronic element.

In the conventional electronic element as shown in FIG. 1, the side wall 170 made of an electric conductor is electrically isolated from the filter circuit. Accordingly, the signal pad 141 at the input and the signal pad 143 at the output may be capacitively coupled via the side wall 170 to cause parasitic capacitance 111 as shown in FIG. 2 such that the propagation characteristics of the filter circuit may be deteriorated. Further, the filter device in which such a filter circuit is used sometimes lacks sufficient separation characteristics.

Certain aspects and embodiments provide an electronic element including a piezoelectric substrate and having a resonator formed on a top surface of the piezoelectric substrate, a side wall made of an electric conductor, and a sealing substrate to prevent a deterioration of the propagation characteristics caused by input and output signals electromagnetically coupled to the side wall. Further, aspects and embodiments may provide sufficient separation characteristics in the filter device in which the electronic element is used.

According to one embodiment an electronic filter comprises a piezoelectric substrate having a top surface, a bottom surface, and a side surface, a filter circuit including a plurality of surface acoustic wave (SAW) resonators formed on the top surface of the piezoelectric substrate, a sealing substrate having a top surface and a bottom surface, and an electrically conductive side wall formed to define a cavity between the top surface of the piezoelectric substrate and the bottom surface of the sealing substrate, the side wall enclosing a periphery of the filter circuit and being connected to a ground potential of the filter circuit.

In one example the filter circuit includes a first signal pad corresponding to an input and a second signal pad corresponding to an output. The plurality of resonators may be arranged to form a ladder-type filter including a plurality of series resonators connected in series between the first signal pad and the second signal pad and a plurality of parallel resonators connected in parallel between the plurality of series resonators and the ground potential. In one example the side wall includes a protrusion projecting toward the filter circuit. In another example the protrusion forms a partition wall between one of the plurality of series resonators and one of the plurality of parallel resonators.

In one example the filter circuit further includes a plurality of ground pads connected to the plurality of parallel resonators. The electronic filter may further comprise a plurality of external signal electrode pads disposed on the top surface of the sealing substrate, each of the plurality of external signal electrode pads being connected to one of the first signal pad and a second signal pad via a first columnar electrode, and a plurality of external ground electrode pads disposed on the top surface of the sealing substrate, each of the plurality of external ground electrode pads being connected to each of the plurality of ground pads via a second columnar electrode. In one example the electronic filter further comprises a partition wall disposed between the second columnar electrode and the side wall.

In one example the filter circuit further includes an additional ground pad that is connected to the side wall and not connected to any of the plurality of resonators.

In another example at least one of the plurality of ground pads is connected to the side wall. The electronic filter may further comprise a wiring layer disposed on the bottom surface of the sealing substrate, the side wall extending between the top surface of the piezoelectric substrate and the wiring layer. In one example electronic filter further comprises a plurality of electrode pads disposed on the top surface of the sealing substrate and connected to the plurality of ground pads via a plurality of columnar electrodes, at least two of the columnar electrodes being connected to each other by the wiring layer. In another example the electronic filter further comprises an external ground electrode pad disposed on the top surface of the sealing substrate and connected to the wiring layer.

In one example the wiring layer includes an additional circuit including at least one of an inductor and a capacitor. In one example the additional circuit includes the inductor, which is formed by a lead wire having a spiral shape or a meandering shape. In another example the additional circuit includes the capacitor, which is formed by lead wires positioned opposing one other.

In one example the electronic filter further comprises a conductive shielding layer disposed on the top surface of the piezoelectric substrate to cover at least one of the plurality of resonators.

In another example the electronic filter further comprises a conductive shielding layer disposed to cover the side surface of the piezoelectric substrate and the side wall. The conductive shielding layer may be further disposed to cover the bottom surface of the piezoelectric substrate.

Certain embodiments are directed to a filter module comprising an example of the electronic filter.

Another embodiment is directed to a wireless device comprising an antenna, a transceiver configured to produce a transmit signal for transmission by the antenna and to process a received signal from the antenna, an antenna switch module coupled between the antenna and the transceiver and configured to selectively configure the wireless device between a receive mode and a transmit mode, and an example of the filter module coupled between the antenna switch module and the transceiver, the filter module being configured to filter at least one of the transmit signal and the received signal.

According to another embodiment a filter device comprises a piezoelectric substrate having a top surface, a pair of filter circuits formed on the top surface of the piezoelectric substrate and including a plurality of resonators, a sealing substrate having a bottom surface, and an electrically conductive side wall disposed to define a cavity between the top surface of the piezoelectric substrate and the bottom surface of the sealing substrate, the side wall enclosing a periphery of the pair filter circuits and being electrically connected to a ground potential of the pair filter circuits.

In one example the pair of filter circuits includes a first filter circuit and a second filter circuit, and the side wall includes a protrusion projecting toward a connection between the first and second filter circuits, the protrusion forming a partition wall between the first and second filter circuits.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "certain embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Examples of electronic elements and filter devices according to various aspects and embodiments of the present invention are described below with reference to the drawings.

Figure 3A:
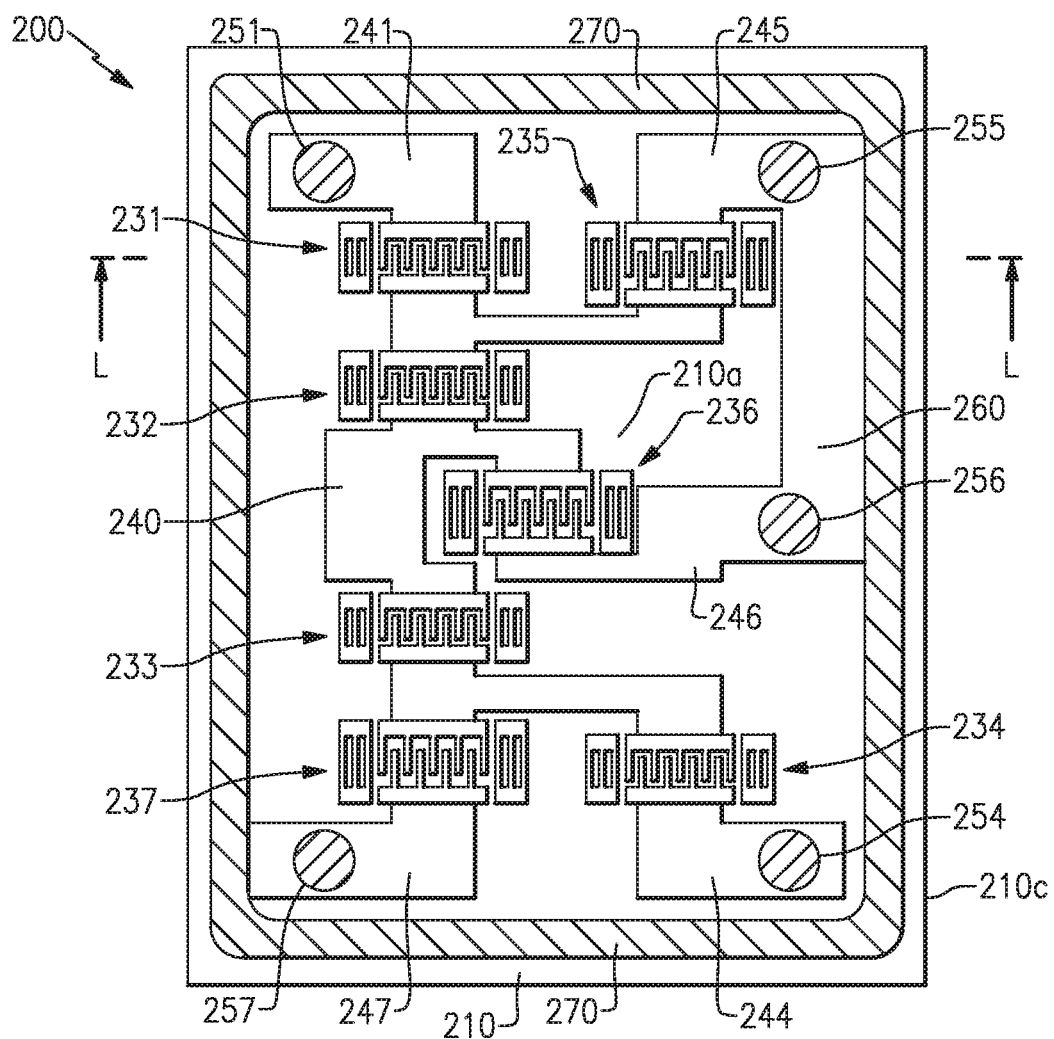
FIG. 3A is a plan view of one example of an electronic element according to aspects of the present invention.
Figure 3B:
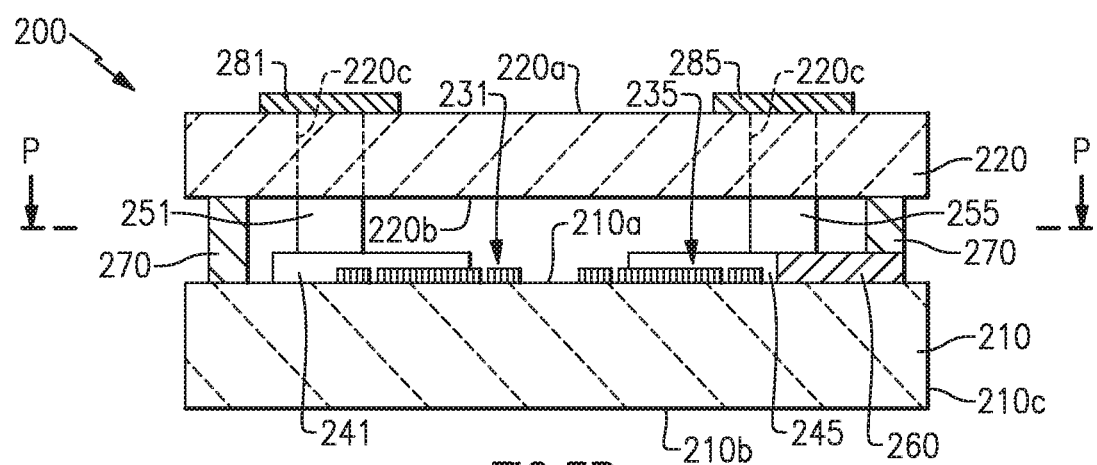
FIG. 3B is a corresponding cross-sectional view of the electronic element shown FIG. 3A.

FIGS. 3A and 3B schematically show configurations of an electronic element 200 according to certain aspects. FIG. 3A is a plan view showing an arrangement of a circuit on a top surface 210a of an element substrate 210, and FIG. 3B is a cross-sectional view taken along line L-L of FIG. 3A. FIG. 3A corresponds to a cross-section taken along line P-P of FIG. 3B.

In the electronic element 200 according to certain embodiments, an electronic circuit including surface acoustic wave (SAW) resonators is formed on a flat top surface 210a of an element substrate 210, which is made of a piezoelectric body such as lithium niobate (LiNbO3). On the top surface 210a of the element substrate 210, there are formed SAW resonators 231, 232, 233, 234, 235, 236, 237, each of which includes an interdigital transducer (IDT) electrode to excite a SAW and a pair of reflector electrodes disposed to sandwich the IDT electrode in a SAW propagation direction. The SAW resonators 231, 232, 233, 234, 235, 236, 237 are connected to each other by a wiring 240 to form a filter circuit.

A side wall 270 made of an electric conductor, such as metal, is formed on the top surface 210a of the element substrate 210 and extends to enclose the electronic circuit along the outer periphery. A sealing substrate 220 made of a material such as silicon (Si), for example, is supported by the side wall 270 such that a bottom surface 220b of the sealing substrate 220 has a certain gap from the top surface 210a of the element substrate 210 and seals the electronic circuit formed on the top surface 210a of the element substrate 210. The side wall 270 has a height corresponding to the gap between the top surface 210a of the element substrate 210 and the bottom surface 220b of the sealing substrate 220. A cavity is defined by the bottom surface 220b of the sealing substrate 220, the top surface 210a of the element substrate 210, and the side wall 270. The electronic circuit formed on the top surface 210a of the element substrate 210 is accommodated within the cavity to be protected by the element substrate 210, the sealing substrate 220 and the side wall 270. A SAW can be excited within the cavity.

On the top surface 210a of the element substrate 210, signal pads 241, 244 are connected to the SAW resonators 231, 234 and ground pads 245, 246, 247 are connected to the SAW resonators 235, 236, 237. Columnar signal electrodes 251, 254 and ground electrodes 255, 256, 257 are formed on the signal pads 241, 244 and the ground pads 245, 246, 247 respectively and pass through the sealing substrate 220 from the bottom surface 220b to the top surface 220a via through-holes 220c. The signal electrodes 251, 254 and the ground electrodes 255, 256, 257 are connected respectively to associated external signal electrode pads 281 and external ground electrode pad 285 formed on the top surface 220a of the sealing substrate 220.

In certain embodiments, the ground pads 245, 246, 247 extend from the SAW resonators 235, 236, 237 to the side wall 270 via portions where the ground electrodes 255, 256, 257 are connected on the top surface 210a of the element substrate 210. The ground pads 245, 246, 247 also extend under a bottom of the side wall 270. Further, additional ground pads 260 extending along an outer periphery of the top surface 210a of the element substrate 210 to connect the ground pads 245, 246 also reach the side wall 270 and even extend to the bottom of the side wall 270. Accordingly, the ground pads 245, 246, 247, 260 are electrically connected to the side wall 270 this embodiment. The side wall 270 is configured to have a ground potential.

Figure 4:
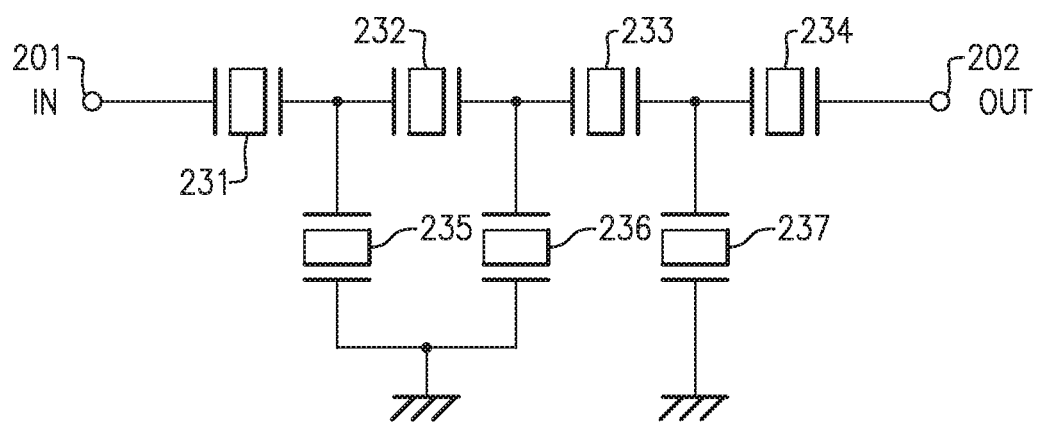
FIG. 4 is a circuit diagram of an electronic element according to aspects of the present invention.

FIG. 4 is a circuit diagram of the electronic element 200 according to certain embodiments. The electronic element 200 forms a ladder-type filter in which the SAW resonators 231, 232, 233, 234 are arranged as series resonators and the SAW resonators 235, 236, 237 are arranged as parallel resonators. As discussed above, the side wall 270 is connected to the ground pads 245, 246, 247, 248 of the electronic circuit formed on the top surface 210a of the element substrate 210 and configured to have a ground potential. Accordingly, electromagnetic coupling between the signal pad 241 at the input 201 and the signal pad 244 at the output 202 via the side wall 270 can be suppressed to ensure stable propagation characteristics of the electronic element 200.

Figure 1A:
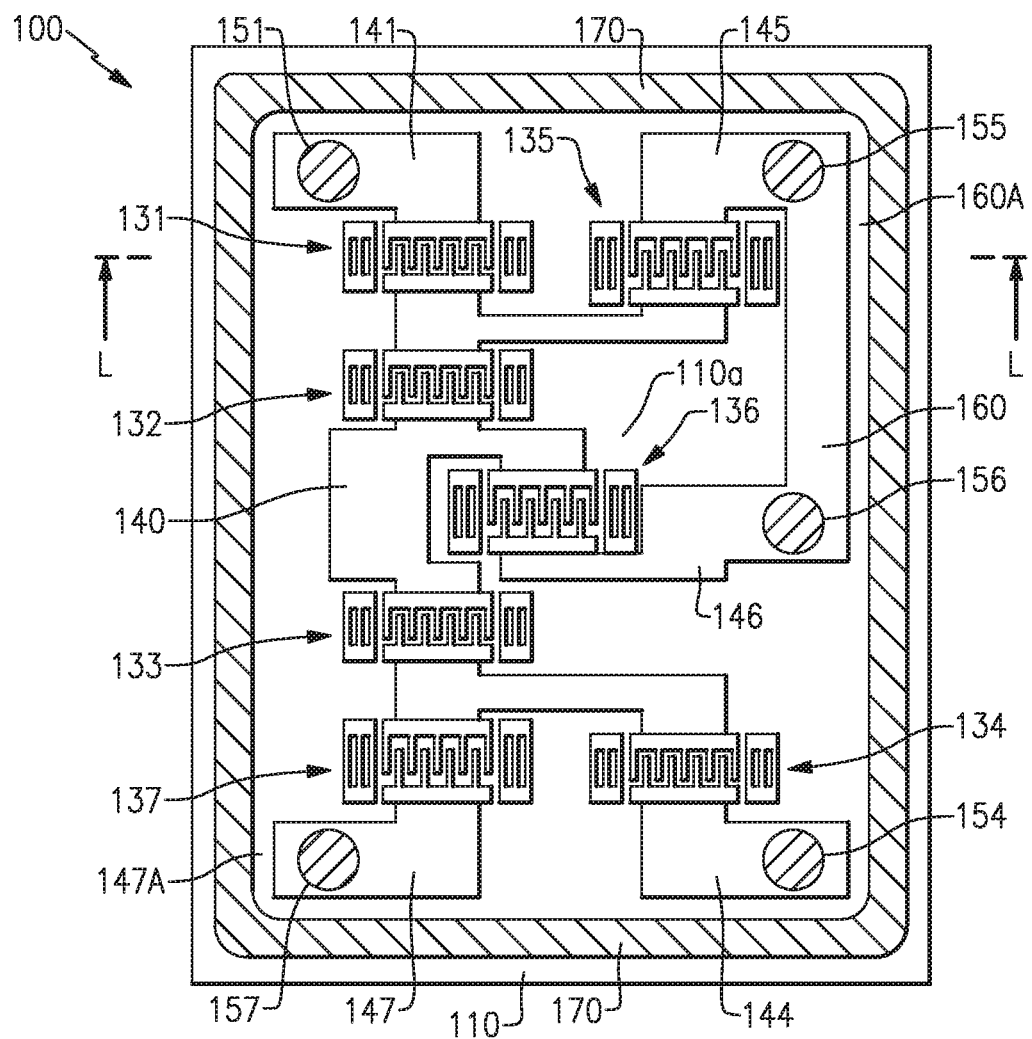
FIG. 1A is a plan view of an example of a conventional electronic element.
Figure 1B:
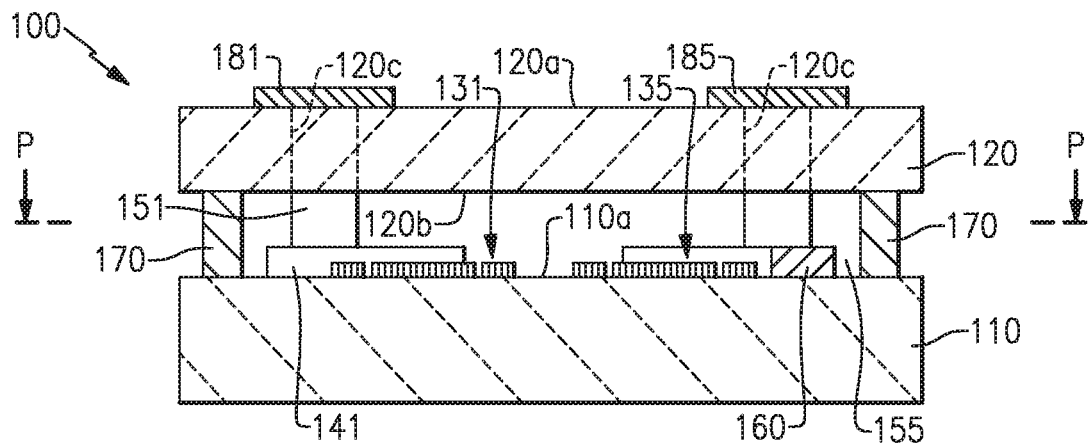
FIG. 1B is a corresponding cross-sectional view of the example of the conventional electronic element shown in FIG. 1A.
Figure 2:
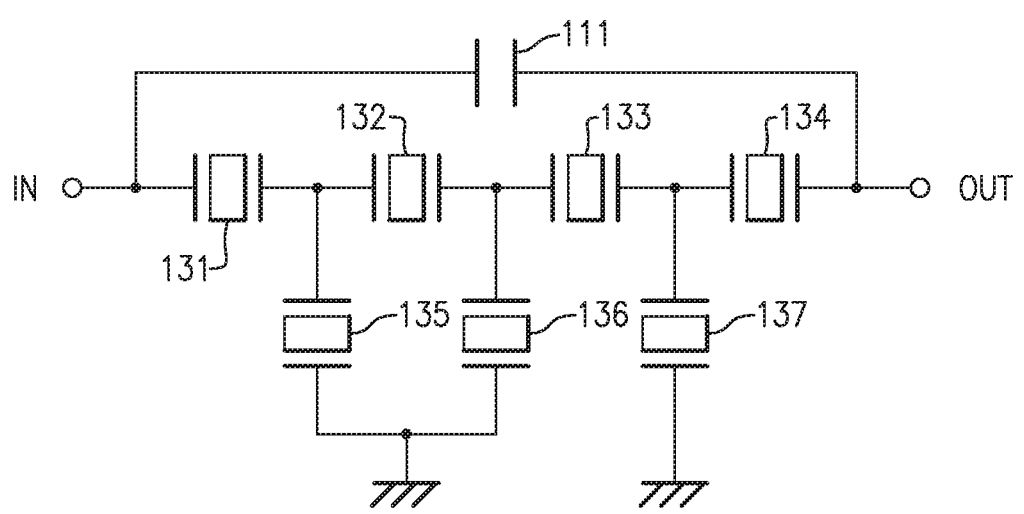
FIG. 2 is a circuit diagram of the conventional electronic element of FIGS. 1A and 1B.
Figure 5:
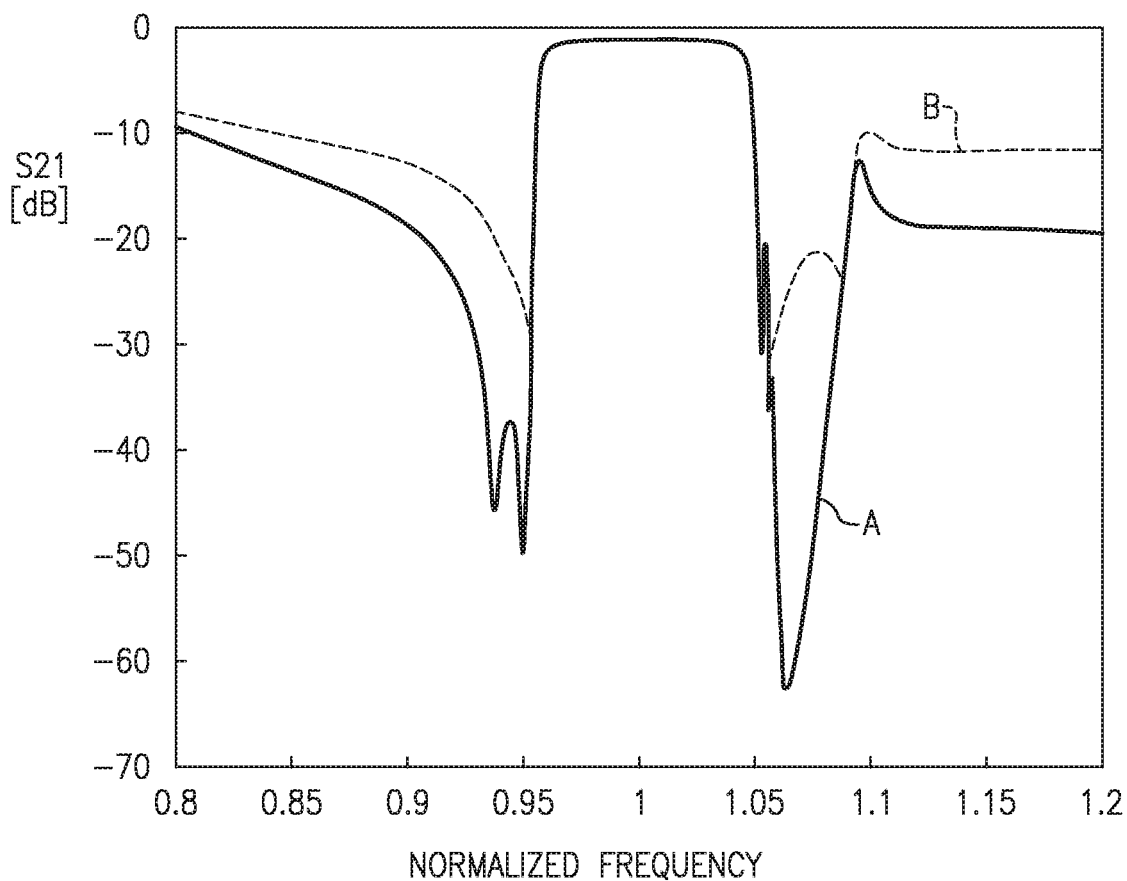
FIG. 5 is a graph showing frequency characteristics of an electronic element according to aspects of the present invention.

FIG. 5 is a graph showing SAW propagation characteristics of an electronic element 200 according to certain embodiments. The horizontal axis represents a normalized frequency and the vertical axis represents an attenuation level. In FIG. 5, a solid line A corresponds to an embodiment of the electronic element 200, whereas a dashed line B corresponds to the frequency characteristics of the conventional electronic element 100 as shown in FIGS. 1A and 1B. It can be seen that, compared with the conventional electronic element, embodiments of the electronic element 200 disclosed herein can achieve a sufficient attenuation in the stop bands of 0.95 or less and 1.05 or greater of the normalized frequency.

Further, with reference to the conventional electronic element 100 of FIGS. 1A and 1B the ground pads 145, 146, 160 are connected to the SAW resonators 135, 136 and spaced apart from the side wall 170 by the gap 160A, and the ground pads 147 are connected to the SAW resonator 137 and spaced apart from the side wall 170 by the gap 147A. According to certain embodiments of the electronic element 200, the ground pads 245, 246, 260, and 247 can be achieved by modifying the ground pad pattern of the conventional electronic element 100 to extend to the bottom of the side wall 270. Accordingly, the electronic element 200 according to certain embodiments can be realized by a pattern modification to the conventional electronic element 100.

According to certain embodiments lithium niobate is used for the piezoelectric body of the element substrate 210, and the ladder-type filter is formed by SAW resonators; however, in other embodiments the piezoelectric body can be lithium tantalate (LiTaO3), for example, the resonators can be film bulk acoustic resonators (FBARs), for example, and the filter can be a double mode SAW (DMS) filter, for example. Further, the side wall 270 can be an electric conductor as exemplified by metal such as aluminum or conductive resin.

Figure 6:
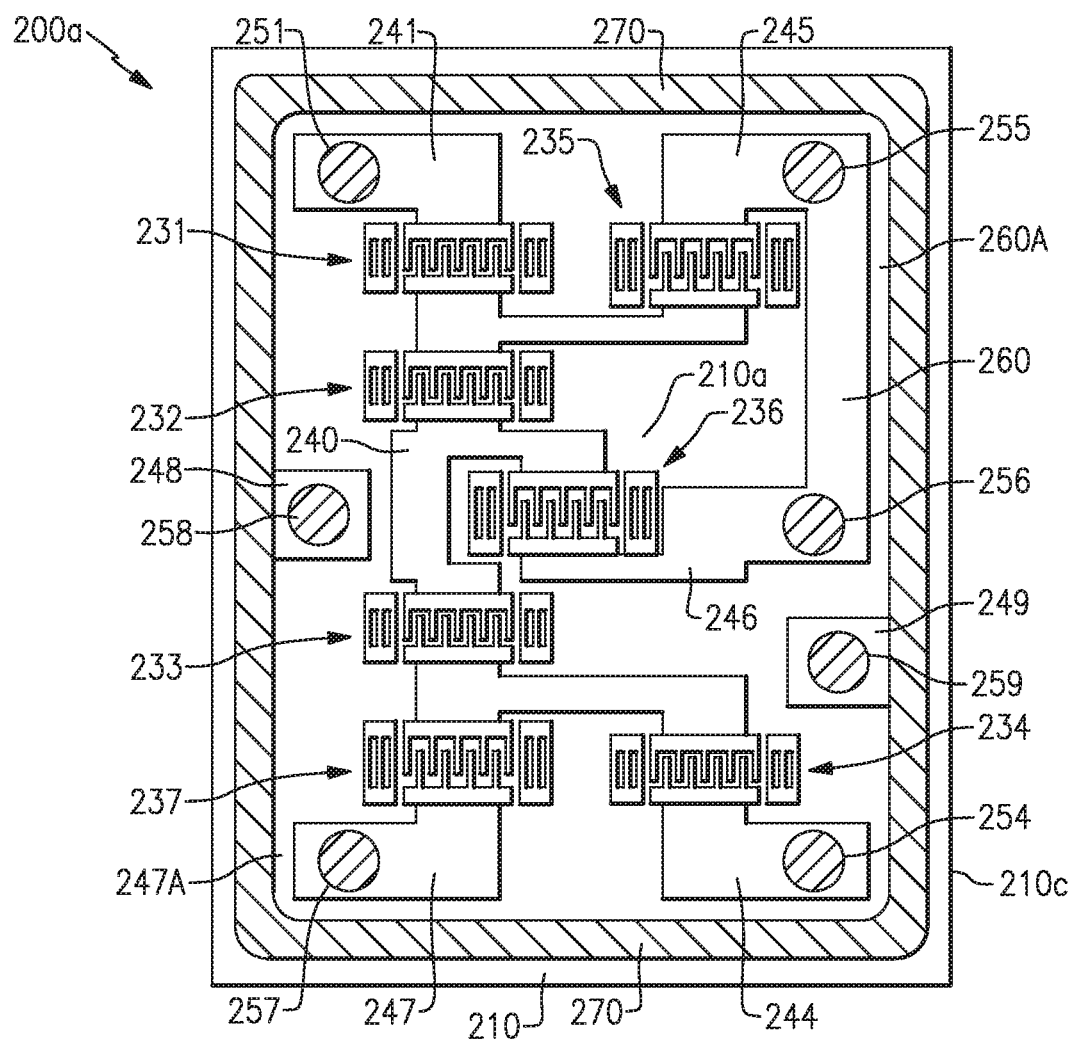
FIG. 6 is a plan view showing the configuration of another example of an electronic element according to aspects of the present invention.

FIG. 6 shows a configuration of another example of an electronic element 200a according to certain aspects. This example is different from the electronic element 200 shown in FIGS. 3A and 3B in that the ground pads 245, 246, 247, 260 connected to the SAW resonators 235, 236, 237 are spaced apart from and not connected to the side wall 270, and in that there are included ground pads 248, 249 and columnar ground electrodes 258, 259 that are arranged to have no connection to the SAW resonators 235, 236, 237.

In the electronic element 200a, the SAW resonators 231, 232, 233, 234, 235, 236, 237 are formed and connected to each other by the wiring 240 on the flat top surface 210a of the element substrate 210 of piezoelectric body to form an electronic circuit such as a filter circuit. The side wall 270 of metal is formed on the top surface 210a of the element substrate 210 and extends to enclose the filter circuit along the outer periphery. As shown in FIG. 3B, for example, the sealing substrate 220 is supported by the side wall 270 to seal the electronic circuit formed on the top surface 210a of the element substrate 210. A cavity is defined by the bottom surface 220b of the sealing substrate 220, the top surface 210a of the element substrate 210, and the side wall 270.

On the top surface 210a of the element substrate 210, the signal pads 241, 244 are connected to the SAW resonators 231, 234 and the ground pads 245, 246, 247 are connected to the SAW resonators 235, 236, 237. The columnar signal electrodes 251, 254 and the ground electrodes 255, 256, 257 are formed on the signal pads 241, 244 and the ground pads 245, 246, 247 respectively and pass through the sealing substrate 220 from the bottom surface 220b to the top surface 220a via the through-holes 220c. The signal electrodes 251, 254 and the ground electrodes 255, 256, 257 are connected respectively to associated external signal electrode pads 281 and the external ground electrode pad 285 formed on the top surface 220a of the sealing substrate 220.

In the example of FIG. 6, the ground pads 245, 246, 247 extend from the SAW resonators 235, 236, 237 to areas where the ground electrodes 255, 256, 257 are connected, but are spaced apart from the side wall 270 on the top surface 210a of the element substrate 210. Further, the ground pad 260 connecting the ground pads 245, 246 and extending along the outer periphery on the top surface 210a of the element substrate 210 is spaced apart from the side wall 270. As shown in FIG. 6, a gap 260A is provided between the ground pads 245, 246, 260 and the side wall 270 and a gap 247A is provided between the ground pad 247 and the side wall 270.

Further, in the electronic element 200a, ground pads 248, 249 are disposed adjacent to the side wall 270 within the cavity above the top surface 210a of the element substrate 210. The ground pads 248, 249 are not connected to the SAW resonators 235, 236, 237, but are connected to the side wall 270. Columnar ground electrodes 258, 259 are formed on the ground pads 248, 249. The ground electrodes 258, 259 pass through the through-holes 220c from the bottom surface 220b to the top surface 220a of the sealing substrate 220 similar to the ground electrode 255 of FIG. 3B, for example. Each of the ground electrodes 258, 259 is connected to an associated external ground electrode pad 285 formed on the top surface 220a of the sealing substrate 220.

In this example, the side wall 270 is configured to have a ground potential by way of its connection to the ground pads 248, 249 and the ground electrodes 258, 259. Accordingly, electromagnetic coupling between the signal pad 241 at the input 201 and the signal pad 244 at the output 202 via the side wall 270 can be suppressed to ensure stable SAW propagation characteristics of the electronic element 200a. Further, compared to the conventional electronic element 100 as shown in FIG. 1, the electronic element 200a can be achieved by adding the ground pads 248, 249 and the ground electrodes 258, 259, as well as the associated external ground electrode pads 285 as shown in FIG. 3B, such that no design modification of the filter circuit is necessary and consequently inclusion of the electronic element 200a in various electronic devices can be readily accomplished.

Figure 7A:
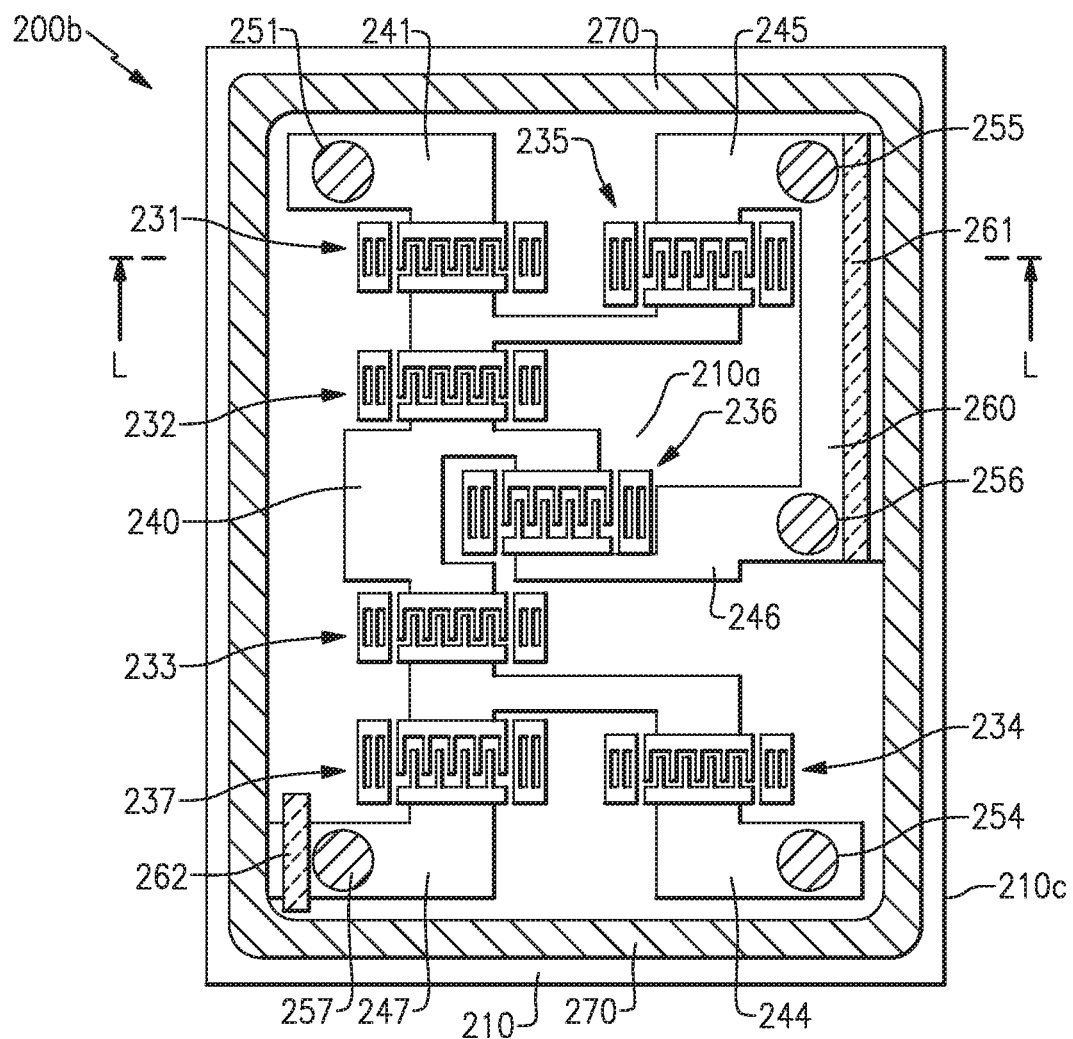
FIG. 7A is a plan view of another example of an electronic element according to aspects of the present invention.
Figure 7B:
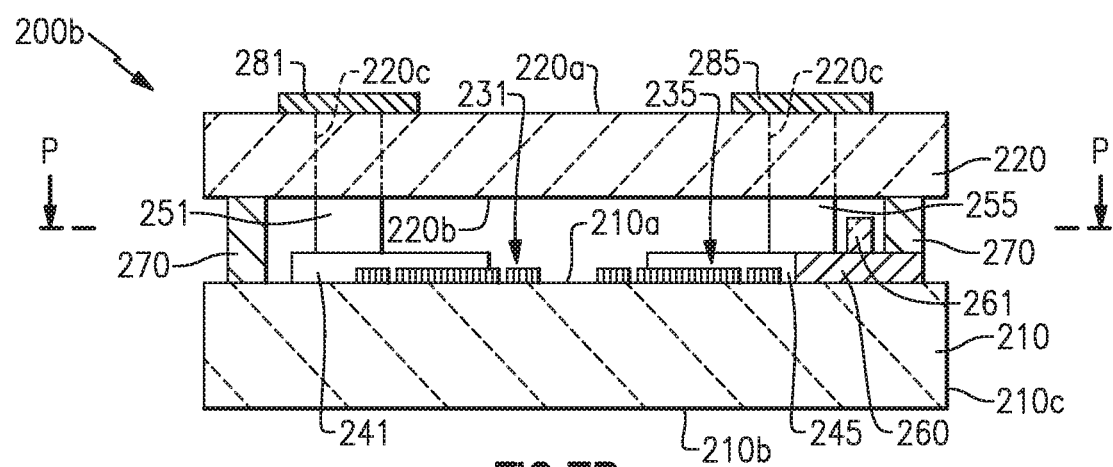
FIG. 7B is a corresponding cross-sectional view of the electronic element shown in FIG. 7A.

FIGS. 7A and 7B show configurations of another example of an electronic element 200b according to certain aspects. This example is different from the electronic element 200 shown in FIGS. 3A and 3B in that a separation wall 261 is disposed along the side wall 270 on the ground pads 245, 246, 260 connected to the SAW resonators 235, 236 and a separation wall 262 is disposed along the side wall 270 on the ground pad 247 connected to the SAW resonator 237.

In the electronic element 200b, the SAW resonators 231, 232, 233, 234, 235, 236, 237 are formed and connected to each other by the wiring 240 on the flat top surface 210a of the element substrate 210 of piezoelectric body to form an electronic circuit such as a filter circuit. The side wall 270 of metal is formed on the top surface 210a of the element substrate 210 and extends to enclose the filter circuit along the outer periphery. The sealing substrate 220 is supported by the side wall 270 on the bottom surface 220b to enclose the filter circuit formed on the top surface 210a of the element substrate 210 and accordingly defines a cavity together with the top surface 210a of the element substrate 210 and the side wall 270.

On the top surface 210a of the element substrate 210, the signal pads 241, 244 are connected to the SAW resonators 231, 234 and the ground pads 245, 246, 247 are connected to the SAW resonators 235, 236, 237. The columnar signal electrodes 251, 254 and the ground electrodes 255, 256, 257 are formed on the signal pads 241, 244 and the ground pads 245, 246, 247, respectively, and pass through the sealing substrate 220 from the bottom surface 220b to the top surface 220a via the through-holes 220c. The signal electrodes 251, 254 and the ground electrodes 255, 256, 257 are connected respectively to associated external signal electrode pads 281 and external ground electrode pad 285 formed on the top surface 220a of the sealing substrate 220.

In this example, the ground pads 245, 246, 247 extend from the SAW resonators 235, 236, 237 to the side wall 270 via portions connected to the ground electrodes 255, 256, 257 on the top surface 210a of the element substrate 210. The ground pads 245, 246, 247 are also disposed under the bottom of the side wall 270. Further, the ground pads 260 extending along an outer periphery of the top surface 210a of the element substrate 210 to connect the ground pads 245, 246 also reach the side wall 270 and may extend to the bottom of the side wall 270.

Still referring to FIGS. 7A and 7B, in this example, a separation wall 261 separates the ground electrodes 255, 256 by a certain gap from the side wall 270 on the ground pads 245, 246, 260. The separation wall 261 has certain width and height to extend along the side wall 270 and is made of a dielectric body such as silicon dioxide. Further, a separation wall 262 separates the ground electrode 257 by a certain gap from the side wall 270 on the ground pads 247. The separation wall 262 also has certain width and height to extend along the side wall 270 and is made of a dielectric body. It is to be appreciated that the separation wall 261, 262 may extend on the top surface 210a of the element substrate 210 beyond areas of the ground pads 245, 246, 247, 260 in directions along the side wall 270.

In this electronic element 200b, the ground pads 245, 246, 247, 260 are electrically connected to the side wall 270, which is configured to have a ground potential. Accordingly, electromagnetic coupling between the signal pad 241 at the input 201 and the signal pad 244 at the output 202 via the side wall 270 can be suppressed to ensure stable SAW propagation characteristics of the electronic element 200b.

Further, in the electronic element 200b, the separation walls 261, 262 disposed along the side wall 270 on the ground pads 245, 246, 247, 260 physically separate the side wall 270 from the ground pads 245, 246, 247, 260 positioned in a region inward from the separation walls 261, 262. Accordingly, in a process of joining the side wall 270 to the ground pads 245, 246, 247, 260 after the process of forming an electronic circuit including the SAW resonators 231, 232, 233, 234, 235, 236, 237, foreign materials such as splashed droplets that may be produced in the joining process can be prevented from entry by the separation walls 261, 262 such that a stable operation of the electronic element 200b can be ensured.

Figure 8:
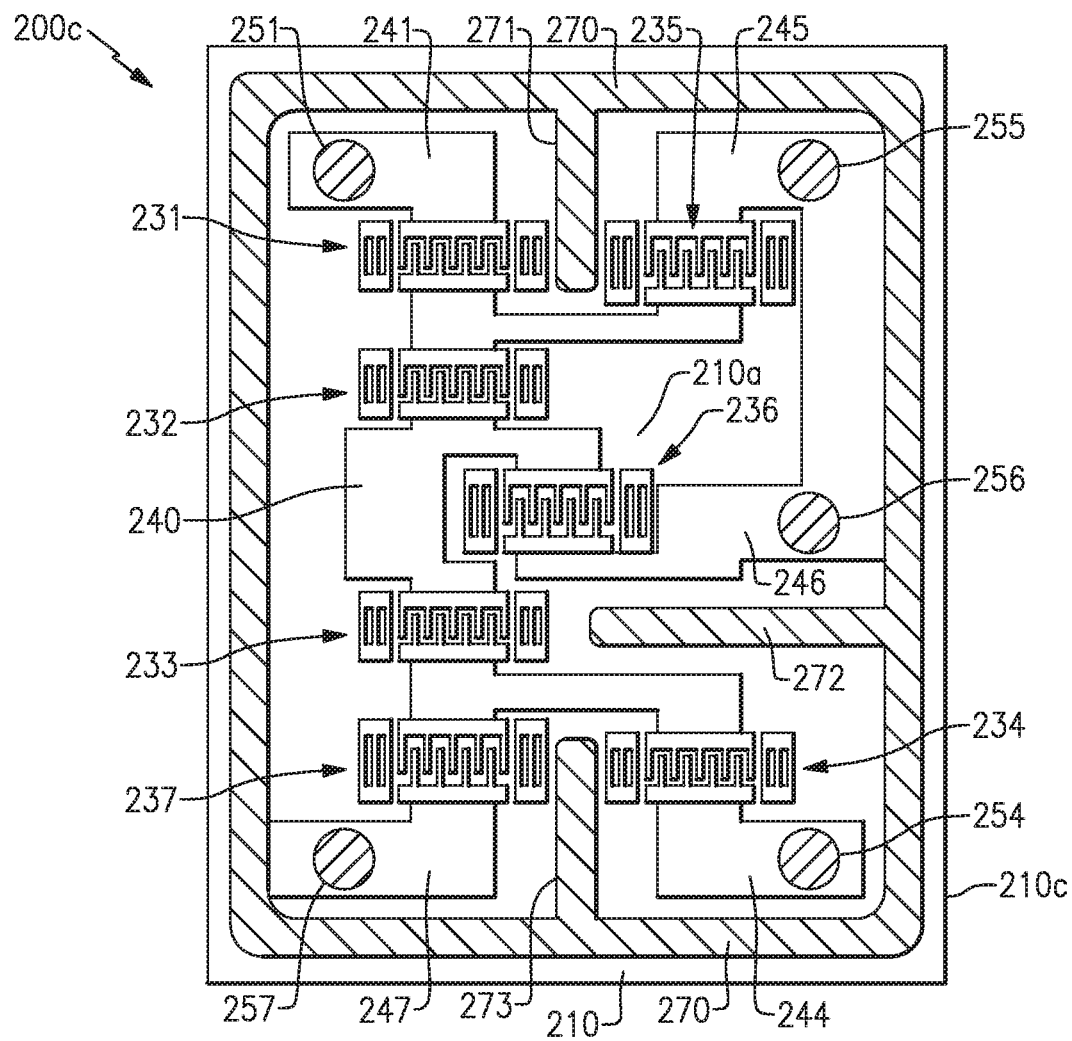
FIG. 8 is a plan view showing the configuration of another example of an electronic element according to aspects of the present invention.

FIG. 8 shows a configuration of another example of an electronic element 200c according to certain aspects. This example is different from the electronic element 200 shown in FIGS. 3A and 3B in that the side wall 270 formed on the top surface 210a of the element substrate 210 includes a plurality of protrusions. The plurality of protrusions includes a first protrusion 271 projecting so as to be sandwiched between the SAW resonators 231 and 235, a second protrusion 272 projecting so as to be sandwiched between the SAW resonators 234 and 236, and a third protrusion 273 projecting to so as be sandwiched between the SAW resonators 234 and 237.

In the electronic element 200c, the SAW resonators 231, 232, 233, 234, 235, 236, 237 are formed and properly connected to each other by the wiring 240 on the flat top surface 210a of the element substrate 210 of piezoelectric body to form an electronic circuit such as a filter circuit. The side wall 270 of metal is formed on the top surface 210a of the element substrate 210 and extends to enclose the filter circuit along the outer periphery. The protrusions 271, 272, 273 have a width and a height similar to those of the side wall 270 and project from the side wall 270 in a direction perpendicular to the extending direction of the side wall 270 to be interposed between the SAW resonators 231 and 235, between the SAW resonators 234 and 236, and between the SAW resonators 234 and 237 respectively.

On the top surface 210a of the element substrate 210, the signal pads 241, 244 are connected to the SAW resonators 231, 234 and the ground pads 245, 246, 247 are connected to the SAW resonators 235, 236, 237. The columnar signal electrodes 251, 254 and the ground electrodes 255, 256, 257 are formed on the signal pads 241, 244 and the ground pads 245, 246, 247, respectively, and pass through the sealing substrate 220 from the bottom surface 220b to the top surface 220a via the through-holes 220c as shown in FIG. 3B for example. The signal electrodes 251, 254 and the ground electrodes 255, 256, 257 are connected respectively to associated external signal electrode pads 281 and external ground electrode pads 285 formed on the top surface 220a of the sealing substrate 220 as shown in FIG. 3B for example.

In the electronic element 200c, the ground pads 245, 246, 247 extend respectively from the SAW resonators 235, 236, 237 to the side wall 270 via portions where the ground electrodes 255, 256, 257 are connected on the top surface 210a of the element substrate 210. The ground pads 245, 246, 247 are also disposed under a bottom of the side wall 270. Further, the ground pads 260 extending along an outer periphery of the top surface 210a of the element substrate 210 to connect the ground pads 245, 246 also reach the side wall 270 and may extend to the bottom of the side wall 270.

In this example, the protrusions 271, 272, 273 of the side wall 270 are interposed between the SAW resonators 231 and 235, between the SAW resonators 234 and 236, and between the SAW resonators 234 and 237 respectively and form partition walls. The protrusions 271, 273 can suppress SAW interference between the SAW resonators 231, 234 as series resonators and the SAW resonators 235, 237 as parallel resonators. Further, the protrusions 272, 273 can electromagnetically shield the SAW resonator 234 corresponding to the final stage of the series resonators and the signal pad 244 at the output from the other portions of the electronic circuit. Accordingly, the interference between the series resonators and the parallel resonators in the ladder-type filter formed by the SAW resonators 231, 234, 235, 236, 237 is prevented and the coupling between the output stage and the other portions is reduced such that the SAW propagation characteristics can be ensured.

It is to be appreciated that although the protrusions 271, 272, 273 are illustrated in FIG. 8 to protrude in a direction substantially perpendicular to the extending direction of the side wall 270, various examples are not limited to this configuration. The protrusions 271, 272, 273 may have any of a variety of different shapes not limited to a shape protruding substantially perpendicular to the side wall 270, provided that a desired function of the protrusions, such as SAW interference suppression or electromagnetic shielding, can be achieved.

Figure 9:
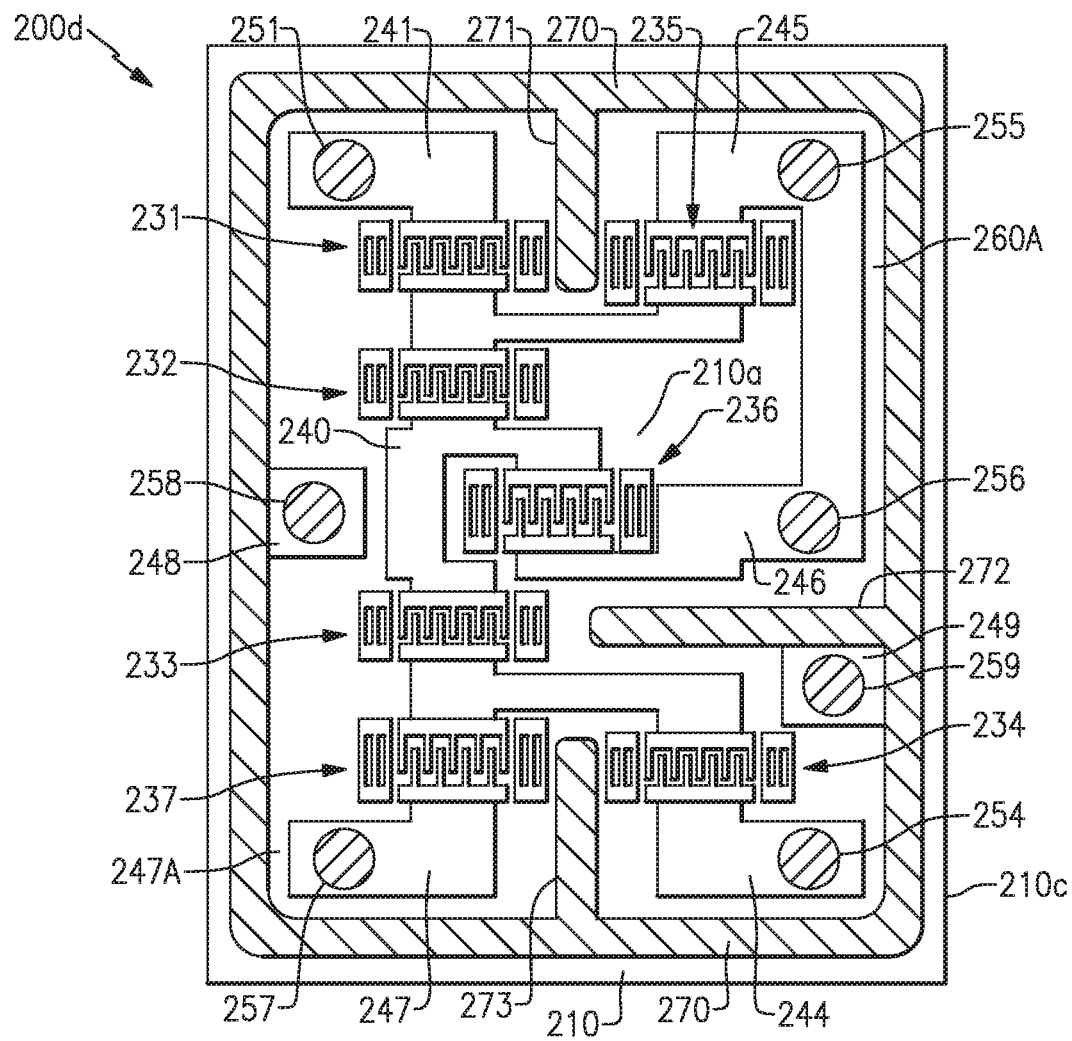
FIG. 9 is a plan view showing the configurations of another example of an electronic element according to aspects of the present invention.

FIG. 9 shows a layout of another example of an electronic element 200d according to certain aspects. The electronic element 200d has a configuration similar to that of the electronic element 200a shown in FIG. 6 except that the side wall 270 formed on the top surface 210a of the element substrate 210 also includes a plurality of protrusions. In particular, the side wall 270 in this example includes a first protrusion 271 projecting between the SAW resonators 231 and 235, a second protrusion 272 projecting between the SAW resonators 234 and 36, and a third protrusion 273 projecting between the SAW resonators 234 and 237.

In the example shown in FIG. 9, the SAW resonators 231, 232, 233, 234, 235, 236, 237 are formed and connected to each other by the wiring 240 on the flat top surface 210a of the element substrate 210 of piezoelectric body to form an electronic circuit such as a filter circuit. The side wall 270 of metal is formed on the top surface 210a of the element substrate 210 and extends to enclose the filter circuit along the outer periphery. The protrusions 271, 272, 273 have a width and a height similar to those of the side wall 270 and project from the side wall 270 in a direction perpendicular to the extending direction of the side wall 270 to be interposed between the SAW resonators 231 and 235, between the SAW resonators 234 and 236, and between the SAW resonators 234 and 237, respectively.

On the top surface 210a of the element substrate 210, the signal pads 241, 244 are connected to the SAW resonators 231, 234, and the ground pads 245, 246, 247 are connected to the SAW resonators 235, 236, 237. The columnar signal electrodes 251, 254 and the ground electrodes 255, 256, 257 are formed on the signal pads 241, 244 and the ground pads 245, 246, 247, respectively, and pass through the sealing substrate 220 from the bottom surface 220b to the top surface 220a via the through-holes 220c, as shown in FIG. 3B for example. The signal electrodes 251, 254 and the ground electrodes 255, 256, 257 are connected respectively to associated external signal electrode pads 281 and external ground electrode pads 285 formed on the top surface 220a of the sealing substrate 220 as shown in FIG. 3B for example.

In the electronic element 200d, the ground pads 245, 246, 247 extend from the SAW resonators 235, 236, 237 to regions where the ground electrodes 255, 256, 257 are connected, but are spaced apart from the side wall 270 on the top surface 210a of the element substrate 210. Further, the ground pad 260 connecting the ground pads 245, 246 and extending along the outer periphery on the top surface 210a of the element substrate 210 is spaced apart from the side wall 270. As shown in FIG. 9, the gap 260A is provided between the ground pads 245, 246, 260 and the side wall 270, and the gap 247A is provided between the ground pad 247 and the side wall 270.

Further, in the electronic element 200d, the ground pads 248, 249 are disposed adjacent to the side wall 270 within the cavity above the top surface 210a of the element substrate 210. The ground pads 248, 249 are not connected to the SAW resonators 235, 235, 237, but are connected to the side wall 270. The columnar ground electrodes 258, 259 are connected to the ground pads 248, 249. The ground electrodes 258, 259 pass through the through-holes 220c from the bottom surface 220b to the top surface 220a of the sealing substrate 220 as shown in FIG. 3B for example. Each of the ground electrodes 258, 259 is connected to an external ground electrode pad formed on the top surface 220a of the sealing substrate 220 as shown in FIG. 3B for example.

In this example, the side wall 270 is configured to have a ground potential by the ground pads 248, 249 and the ground electrodes 258, 259, similar to the example discussed above with reference to FIG. 6. Accordingly, electromagnetic coupling between the signal pad 241 at the input 201 and the signal pad 244 at the output 202 via the side wall 270 can be suppressed to ensure stable propagation characteristics of the electronic element 200d. Further, compared to the conventional electronic element 100 as shown in FIG. 1, the electronic element 200d can be achieved by adding the ground pads 248, 249 and the ground electrodes 258, 259, such that no design modification of the filter circuit is necessary and consequently inclusion of an electronic element 200d in other devices can be readily accomplished.

Further, in the electronic element 200d, the protrusions 271, 272, 273 of the side wall 270 are interposed between the SAW resonators 231 and 235, between the SAW resonators 234 and 236, and between the SAW resonators 234 and 237, respectively, and form partition walls. The protrusions 271, 273 can suppress SAW interference between the SAW resonators 231, 234 as series resonators and the SAW resonators 235, 237 as parallel resonators in a ladder-type filter, such as that shown in FIG. 4. Further, the protrusions 272, 273 can electromagnetically shield the SAW resonator 234 corresponding to the final stage of the series resonators and the signal pad 244 at the output 202 from the other portions of the electronic circuit. Accordingly, the interference between the series resonators and the parallel resonators in the ladder-type filter formed by the SAW resonators 231, 234, 235, 236, 237 can be prevented, and the coupling between the output stage and the other portions can be reduced such that the SAW propagation characteristics can be ensured.

Figure 10:
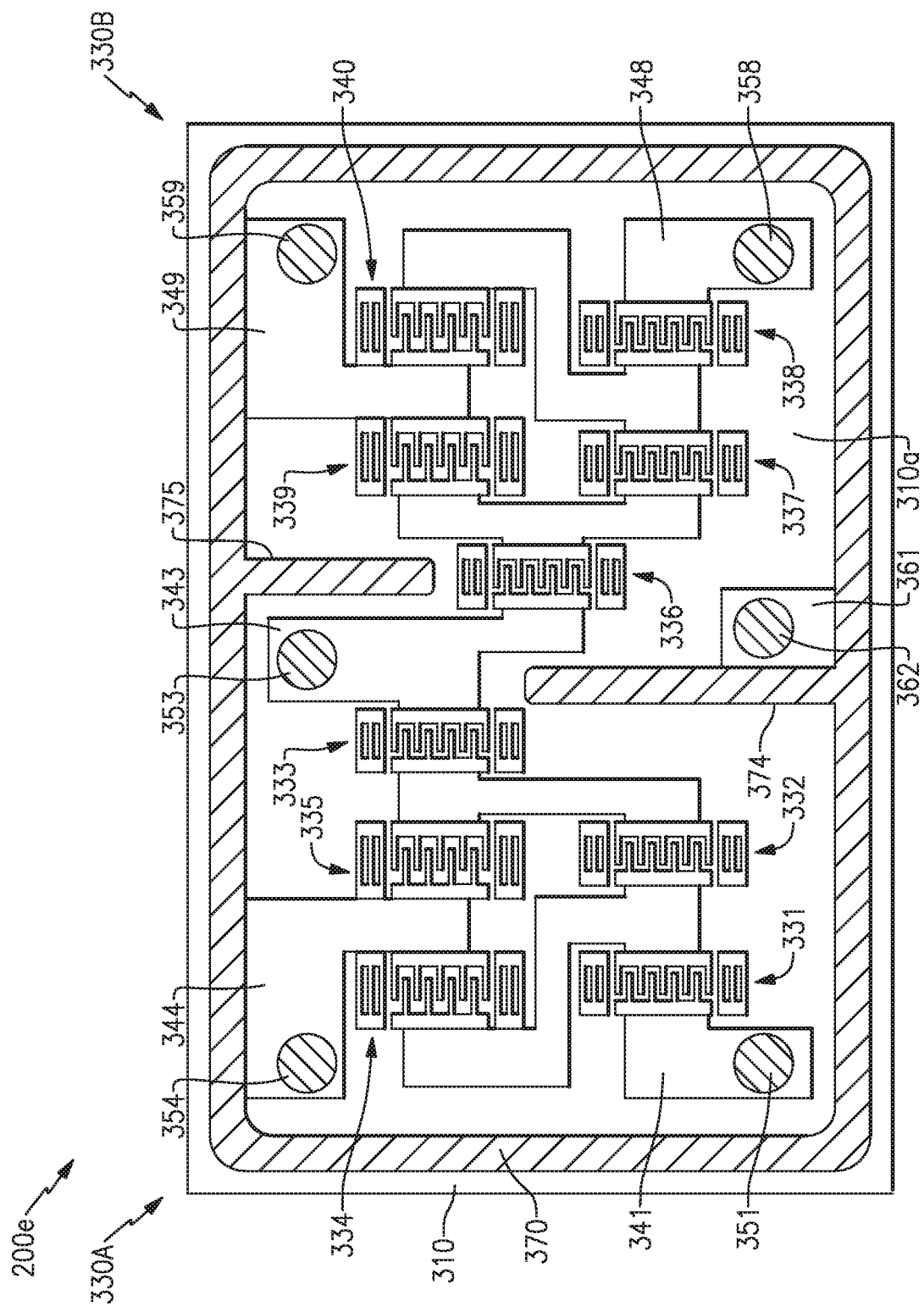
FIG. 10 is a plan view showing the configurations of another example of an electronic element according to aspects of the present invention.

FIG. 10 is a plan view of another example of an electronic element 200e according to certain aspects. In this example, a filter device including two filter circuits 330A, 330B is formed on a flat top surface 310a of an element substrate 310 of piezoelectric substrate such as lithium niobate. The filter circuit 330A includes SAW resonators 331, 332, 333, 334, 335. The filter circuit 330B includes SAW resonators 336, 337, 338, 339, 340. A side wall 370 made of an electric conductor such as metal is formed on the top surface 310a of the element substrate 310 to enclose the circuits along the outer periphery. The side wall 370 supports a sealing substrate (not shown). The top surface 310a of the element substrate 310, the side wall 370, and the top surface of the sealing substrate define a cavity and accommodate the filter circuits 330A, 330B.

In the filter circuit 330A, a columnar signal electrode 351 is connected to a signal pad 341 connected to the SAW resonator 331, and a columnar ground electrode 354 is connected to a ground pad 344 connected to the SAW resonators 334, 335. The ground pad 344 is connected to and reaches the side wall 370. Further, a columnar signal electrode 353 is connected to the signal pad 343 connected to the SAW resonator 333 of the filter circuit 330A and the SAW resonator 336 of the filter circuit 330B.

In the filter circuit 330B, a columnar signal electrode 358 is connected to the signal pad 348 connected to the SAW resonator 338, and a columnar ground electrode 359 is connected to the ground pad 349 connected to the SAW resonators 339, 340. Further, the ground pad 361 that neither of the filter circuits 330A and 330B is connected to is adjacent and connected to the side wall 370. A ground electrode 362 is connected to the ground pad 361.

The signal electrode 351 and the ground electrode 354 of the filter circuit 330A, the signal electrode 358 and the ground electrode 359 of the filter circuit 330B, and further the ground electrode 362 having no connections to the filter circuit 330A or 330B pass through the through-holes from the bottom surface to the top surface of the sealing substrate (not shown), similar to the signal electrode 251 and the ground electrode 255 as shown in FIG. 3B for example. The signal electrodes 351, 358 and the ground electrodes 354, 359, 362 are connected to signal electrode pads and ground electrode pads formed on the top surface of the sealing substrate (not shown).

In this example, a protrusion 374 having a width and a height similar to those of the side wall 370 formed on the top surface 310a of the element substrate 310 extends from the side wall 370 generally at the center of a side of a substantial rectangular defined by the outer periphery of the top surface 310a of the element substrate 310 toward the filter circuits 330A, 330B in a direction substantially perpendicular to the extending direction of the side wall 370 to separate the filter circuit 330A from the filter circuit 330B. Further, a protrusion 375 configured similarly to the protrusion 374 projects from the side wall 370 generally at the center of the opposite side toward the filter circuit 330A, 330B and extends to separate the filter circuit 330A from the filter circuit 330B. The signal pad 343 passes through a gap formed between the tips of the protrusions 374 and 375 to connect the filter circuits 330A and 330B.

In the electronic element 200e, the protrusions 374, 375 of the side wall 370 form electrical shields between the filter circuits 330A and 330B such that the SAW interference can be suppressed and each of the filter circuits 330A, 330B can be ensured to have operational stability. The side wall 370 is electrically connected to the ground pads 344, 361 and configured to have a ground potential. Accordingly, electromagnetic coupling between the signal pad 341 at the input and the signal pad 348 at the output via the side wall 370 can be suppressed to ensure stable SAW propagation characteristics of the electronic element 200e. Further, this configuration may improve separation characteristics of a filter device including the filter circuits 330A, 330B.

Figure 11A:
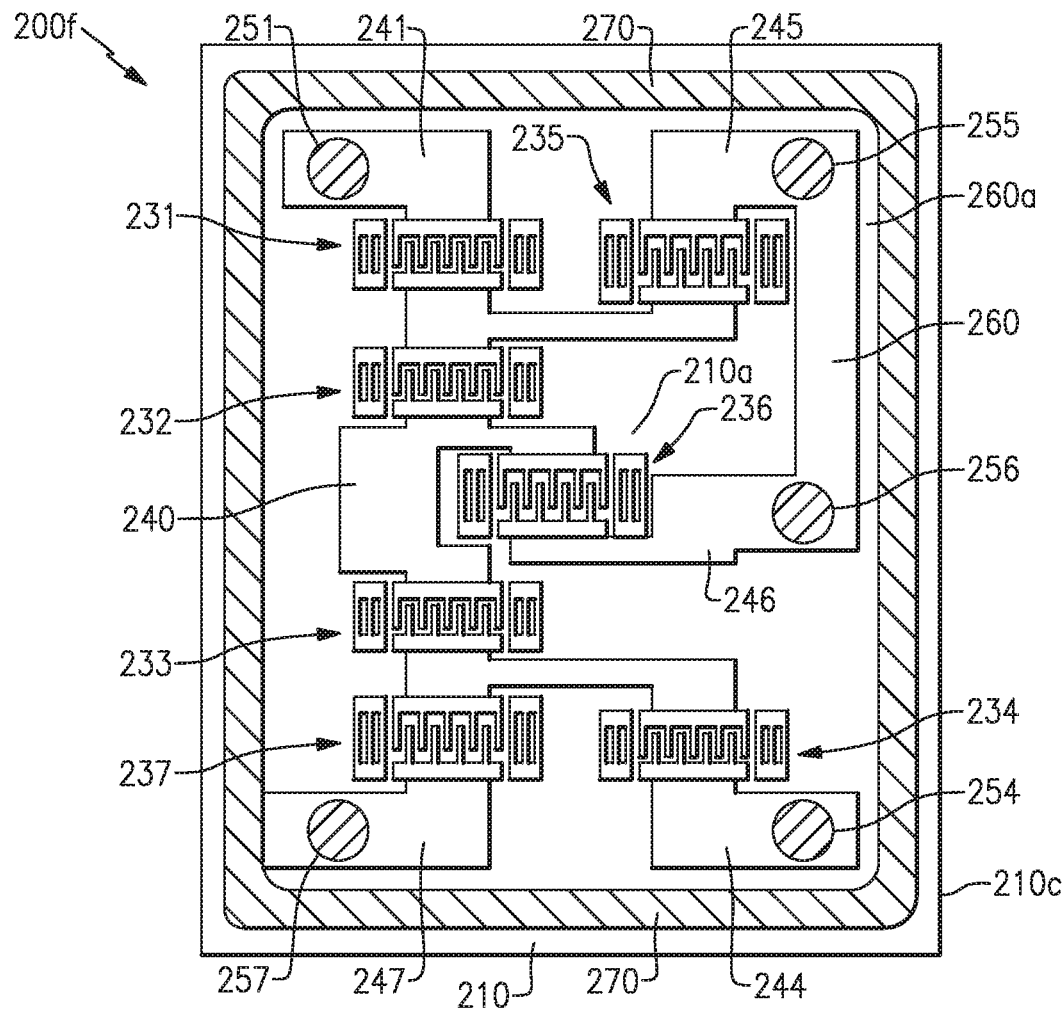
FIG. 11A is a plan view showing the configurations of another example of an electronic element according to aspects of the present invention.
Figure 11B:
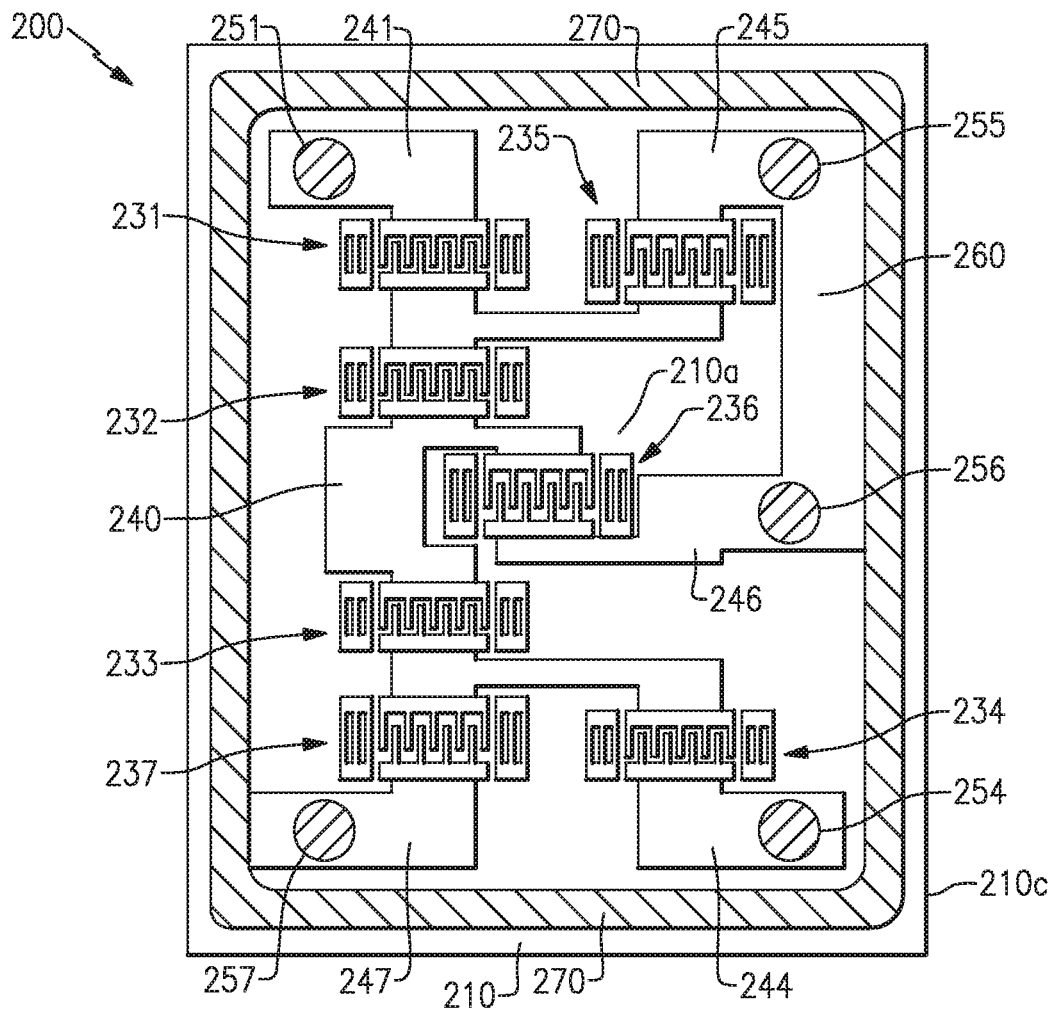
FIG. 11B is a plan view showing a comparative example of the electronic element according to aspects of the present invention.

FIG. 11A illustrates another example of an electronic element 200f according to certain aspects. In this example, the ground pads and the side wall are connected via a single location. For comparison purposes, FIG. 11B shows an electronic element 200 similar to the example shown in FIG. 3A, in which the ground pads and the side wall are connected via two locations. The electronic element 200f of FIG. 11A is further different from the electronic element 200 shown in FIGS. 3A and 3B in that the ground pads 245, 246, 260 connected to the SAW resonators 235, 236 are spaced apart from and not connected to the side wall 270.

In the electronic element 200f, the SAW resonators 231, 232, 233, 234, 235, 236, 237 are formed and connected to each other by the wiring 240 on the flat top surface 210a of the element substrate 210 of piezoelectric body to form an electronic circuit such as a filter circuit. The side wall 270 of metal is formed on the top surface 210a of the element substrate 210 and extends to enclose the filter circuit along the outer periphery. The sealing substrate 220 (FIG. 3B) is supported by the side wall 270 on the bottom surface 220b to enclose the filter circuit formed on the top surface 210a of the element substrate 210 and accordingly defines a cavity together with the top surface 210a of the element substrate 210 and the side wall 270.

On the top surface 210a of the element substrate 210, the signal pads 241, 244 are connected to the SAW resonators 231, 234, and the ground pads 245, 246, 247 are connected to the SAW resonators 235, 236, 237. The columnar signal electrodes 251, 254 and the ground electrodes 255, 256, 257 are formed on the signal pads 241, 244 and the ground pads 245, 246, 247, respectively, and pass through the sealing substrate 220 from the bottom surface 220b to the top surface 220a via the through-holes 220c, as shown in FIG. 3B for example. The signal electrodes 251, 254 and the ground electrodes 255, 256, 257 are connected respectively to associated external signal electrode pads 281 and external ground electrode pad 285 formed on the top surface 220a of the sealing substrate 220, as shown in FIG. 3B for example.

In the electronic element 200f, the ground pads 245, 246 extend from the SAW resonators 235, 236 to regions where the ground electrodes 255, 256 are connected, but are spaced apart from the side wall 270 on the top surface 210a of the element substrate 210. Further, the ground pad 260 connecting the ground pads 245, 246 and extending along the outer periphery on the top surface 210a of the element substrate 210 is spaced apart from the side wall 270. As shown in FIG. 11A, the gap 260A is provided between the ground pads 245, 246, 260 and the side wall 270, whereas the ground pad 247 extends from the SAW resonator 237 to the side wall 270 and is connected to the side wall 270 via portions connected to the ground electrode 257.

Compared with the electronic circuit 200f shown in FIG. 11A, the electronic circuit 200 illustrated in FIG. 11B is different in several ways. First, there is no gap 260A. Second, the ground pads 245, 246 extend from the SAW resonators 235, 236 to the side wall 270 and are connected to the side wall 270 via portions where the ground electrodes 255, 256 are connected. Third, the ground pad 260 connecting the ground pads 245, 246 and extending along the outer periphery of the top surface 210a of the element substrate 210 also reaches and is connected to the side wall 270. In the example shown in FIG. 11B, the side wall 270 is connected to the ground pads via two locations, one corresponding to the ground pads 245, 246, 260, and the other corresponding to the ground pad 247.

Figure 12A:
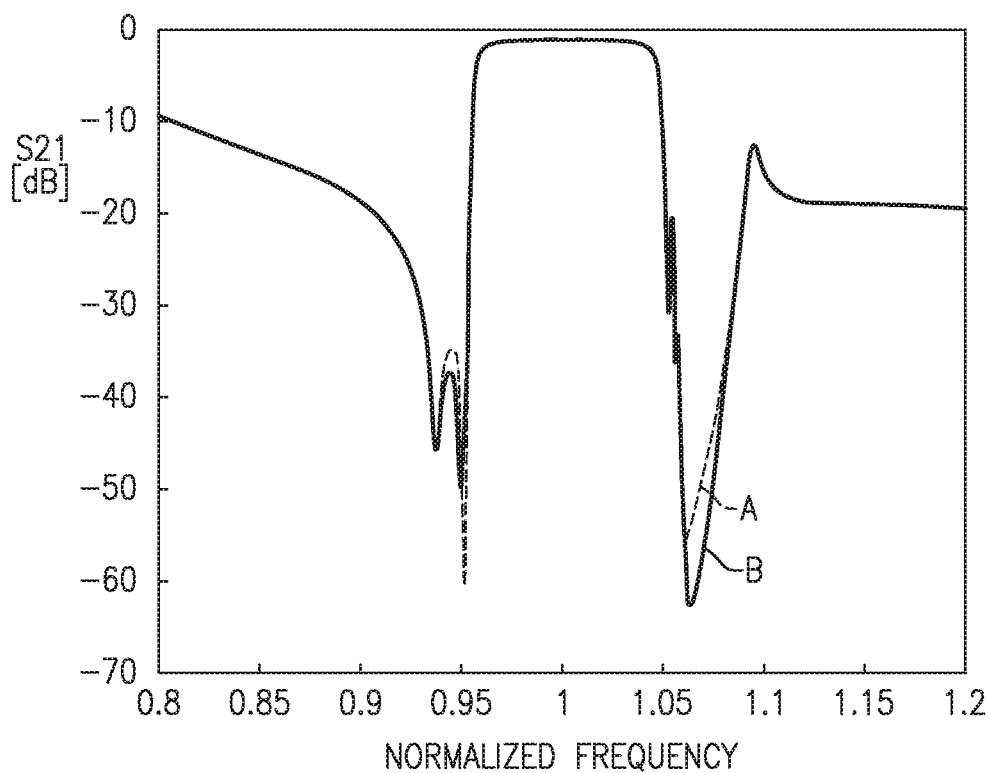
FIG. 12A is a graph showing frequency characteristics of the electronic element of FIGS. 11A and 11B.
Figure 12B:
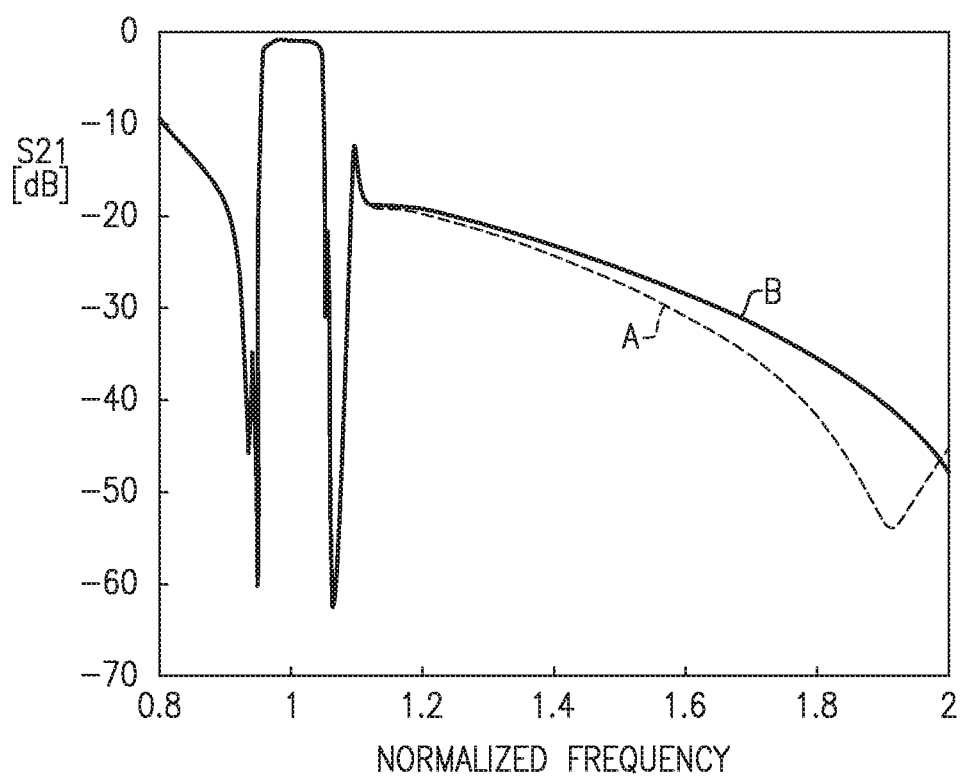
FIG. 12B is graph showing the frequency characteristics of FIG. 12A over an extended frequency range.

FIGS. 12A and 12B show SAW propagation characteristics for an example of the electronic element 200f. FIG. 12A shows frequency characteristics near the passband. The horizontal axis represents a normalized frequency and the vertical axis represents an attenuation level. In FIG. 12A, a solid line B corresponds to the frequency characteristics of an example of the electronic element 200 shown in FIG. 11B, whereas a dashed line A corresponds to those of the example of the electronic element 200f shown in FIG. 11A. FIG. 12B similarly shows the attenuation level over a wider band.

Referring to FIG. 12A, it can be seen that, near the passband, or 0.95 or less and 1.05 or greater of the normalized frequency, greater attenuation can be obtained by the example of FIG. 11B. On the other hand, referring to FIG. 12B, greater attenuation can be obtained in a higher range by the configuration of the ground pads connected to the side wall 270 of the electronic element 200f via a single location according to the example shown in FIG. 11A. Accordingly, the attenuation characteristics near the passband and also in a higher range can be controlled by determining whether the side wall 270 of the electronic element 200 should be connected to the ground pads via a single location or two locations.

It is to be appreciated that the ground pad 247 is electrically connected to the side wall 270, and the side wall 270 is configured to have a ground potential in the example of FIG. 11A. Accordingly, electromagnetic coupling between the signal pad 241 at the input 201 and the signal pad 244 at the output 202 via the side wall 270 can be suppressed to ensure stable SAW propagation characteristics of the electronic element 200f.

Figure 13:
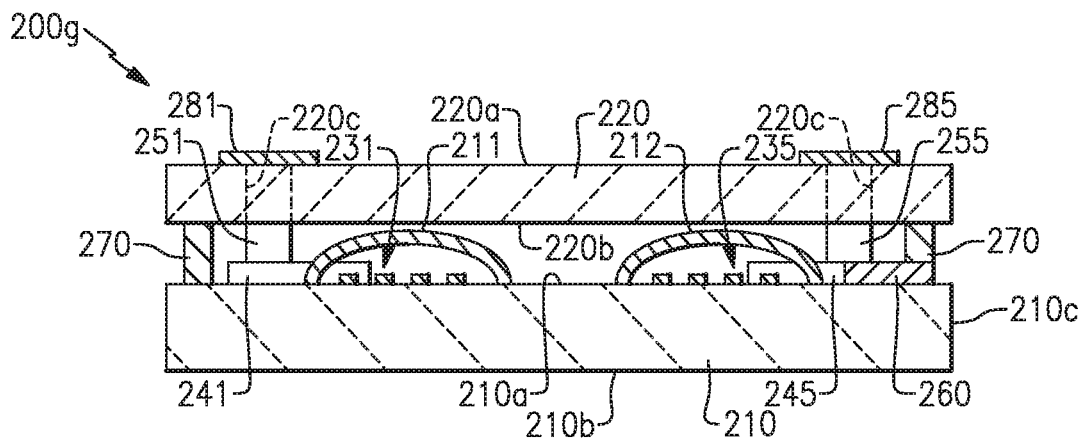
FIG. 13 is a cross-sectional view showing the configurations of another example of an electronic element according to aspects of the present invention.

FIG. 13 shows another example of an electronic element 200g according to certain aspects. FIG. 13 corresponds to a cross-sectional view of the electronic element 200 as shown in FIG. 3B taken along line L-L of FIG. 3A. The electronic element 200g is different from the example shown in FIGS. 3A and 3B in that a dome-shaped shielding layer is formed over each of the SAW resonators 231, 232, 233, 2234, 235, 236, 237.

As shown in FIG. 13, shielding layers 211, 212 made of metal are formed to cover the SAW resonators 231, 235 respectively. Similarly, shielding layers are formed over the other SAW resonators 232, 233, 234, 236, 237. The shielding layer(s) may be connected to the side wall 270 to have a ground potential or may not be connected to the side wall 270.

In the electronic element 200g, disposing the shielding layer(s) over each of the SAW resonators 231, 232, 233, 234, 235, 236, 237 can prevent electromagnetic coupling with the other circuit elements to eliminate SAW interference. Further, the shielding layers can shield the SAW resonators from the sealing substrate 220 and this shielding can be performed separately from the shielding of the side wall 270. Accordingly, in this example, stable operation of the electronic element 200g can be ensured. Further, similar to the example of FIGS. 3A and 3B, electromagnetic coupling between the signal pad 241 at the input 201 and the signal pad 244 at the output 202 via the side wall 270 can be suppressed to ensure stable propagation characteristics of the electronic element 200g.

Figure 14:
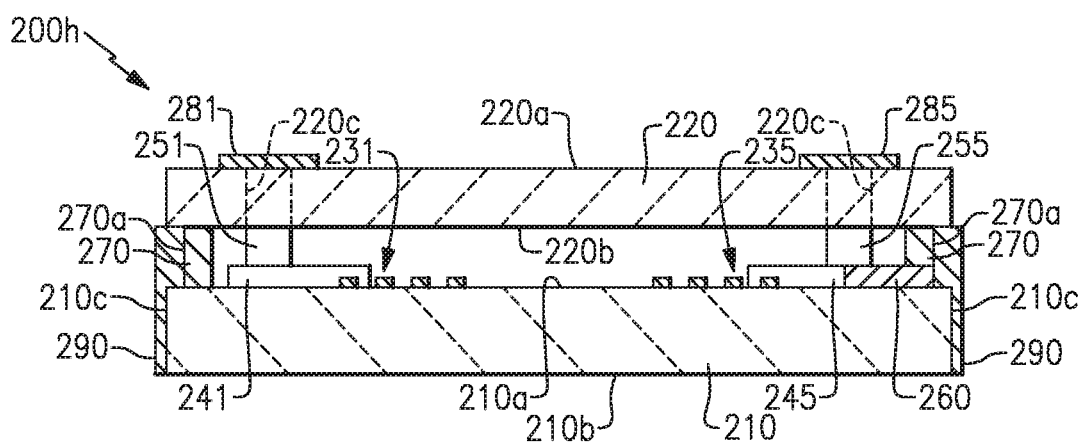
FIG. 14 is a cross-sectional view showing the configurations of another example of an electronic element according to aspects of the present invention.

FIG. 14 shows another example of an electronic element 200h according to certain aspects. FIG. 14 corresponds to a cross-sectional view of the electronic element 200 as shown in FIG. 3B taken along line L-L of FIG. 3A. The electronic element 200h is different from the example of FIGS. 3A and 3B in that a shielding layer 290 of metal is formed to cover a side surface 210c of the element substrate 210 and an outer surface 270a of the side wall 270.

As shown in FIG. 14, a shielding layer 290 of metal is formed to extend from the bottom surface 210b of the element substrate 210 to the bottom surface 220b of the sealing substrate 220 in the electronic element 200h. The shielding layer 290 at least partially covers the side surface 210c of the element substrate 210 and the side wall 270. In this example, such a shielding layer 290 can shield the electronic circuit formed on the top surface 210a of the element substrate 210 from external electromagnetic fields. Accordingly, stable operation of the electronic element 200h can be ensured. Further, similar to the example of FIGS. 3A and 3B, electromagnetic coupling between the signal pad 241 at the input 201 and the signal pad 244 at the output 202 via the side wall 270 can be suppressed to ensure stable SAW propagation characteristics of the electronic element 200h.

Figure 15:
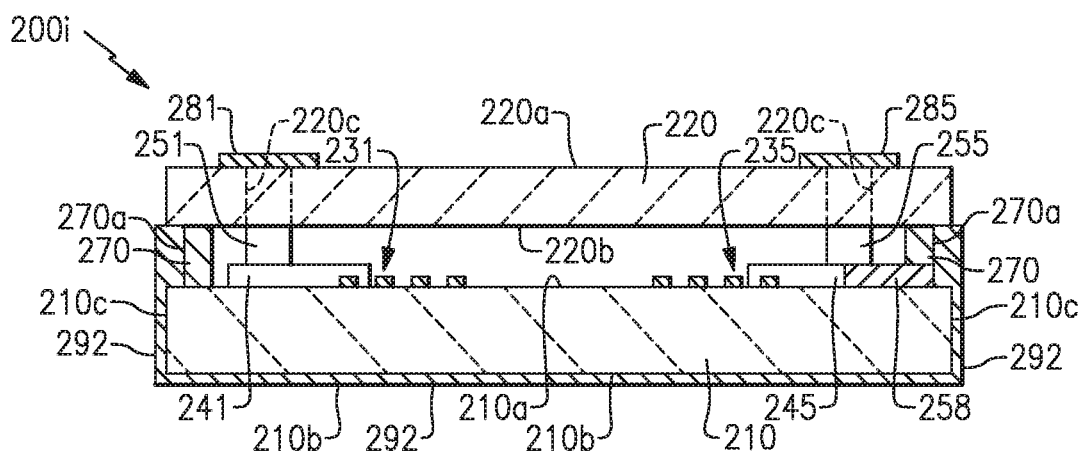
FIG. 15 is a cross-sectional view showing the configurations of another example of an electronic element according to aspects of the present invention.

FIG. 15 illustrates another example of an electronic element 200i according to certain aspects. FIG. 15 corresponds to a cross-sectional view of the electronic element 200 as shown in FIG. 3B taken along line L-L of FIG. 3A. The electronic element 200i is similar to the example shown in FIGS. 3A and 3B, but different in that a shielding layer 292 of metal covers the entire bottom surface 210b and the side surface 210c of the element substrate 210 and an outer surface 270a of the side wall 270.

As shown in FIG. 15, the shielding layer 292 of metal is formed in the electronic element 200i to cover the entire bottom surface 210b and extends in contact with the side surface 210c to the top surface 210a of the element substrate 210. The shielding layer 292 further extends in contact with the outer surface 270a of the side wall 270 to the bottom surface 220b of the sealing substrate 220 with a certain thickness from the outer surface 270a of the side wall 270. In this example, such a shielding layer 292 can shield the electronic circuit formed on the top surface 210a of the element substrate 210 from external electromagnetic fields. In the electronic element 200i, because the bottom surface 120b of the element substrate 210 is also covered with the shielding layer 292, higher shielding effect can be achieved compared to the electronic element 200h in which the bottom surface 210b is not covered with the shielding layer 290. Accordingly, in the example of FIG. 15, further stable operation of the electronic element 200i can be ensured. In addition, similar to the example of FIGS. 3A and 3B, electromagnetic coupling between the signal pad 241 at the input 201 and the signal pad 244 at the output 202 via the side wall 270 can be suppressed to ensure stable SAW propagation characteristics of the electronic element 200i.

Figure 16:
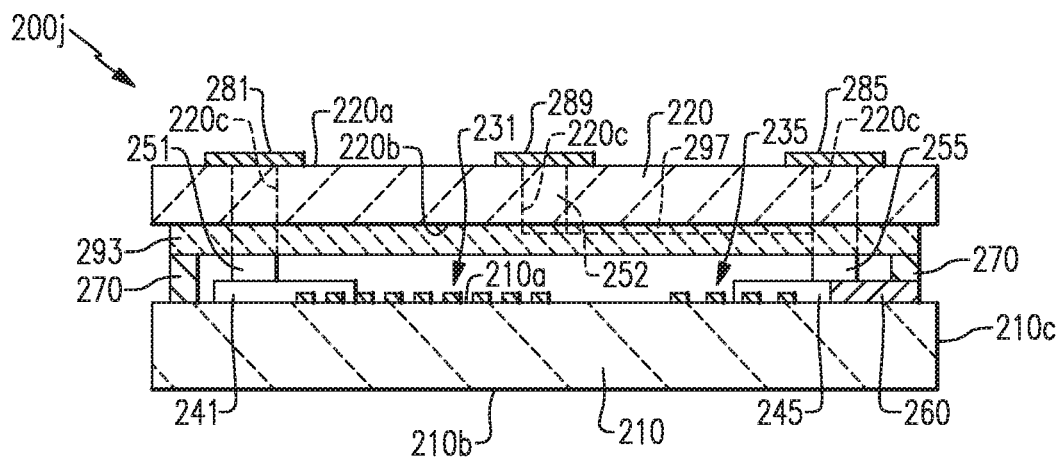
FIG. 16 is a cross-sectional view showing the configurations of another example of an electronic element according to aspects of the present invention.

FIG. 16 shows another example of an electronic element 200j according to certain examples. FIG. 16 corresponds to a cross-sectional view of the electronic element 200 as shown in FIG. 3B taken along line L-L of FIG. 3A. The electronic element 200j is similar to the electronic element 200 of FIGS. 3A and 3B, but different in that a wiring layer 293 is disposed on the bottom surface 220b of the sealing substrate 220 and an external ground electrode pad 289 is disposed on the top surface 220a of the sealing substrate 220.

As shown in FIG. 16, in this example, the wiring layer 293 is disposed in contact with the bottom surface 220b of the sealing substrate 220 and is interposed between the side wall 270 disposed on the top surface 210a of the element substrate 210 and the bottom surface 220b of the sealing substrate 220. The wiring layer 293 is formed by arranging a conductive material in a dielectric body.

Further, in the example shown in FIG. 16, the external ground electrode pad 289 is disposed on the top surface 220a of the sealing substrate 220. A columnar ground electrode 252 connected to the external ground electrode pad 289 passes through a through-hole 220c of the sealing substrate 220 to the wiring layer 293 and then is connected to another ground electrode 255 via a ground pad 297 formed within the wiring layer 293.

The example of FIG. 16 enables a connection between a plurality of ground electrodes 255 and 252 by including the wiring layer 293. Accordingly, design flexibility in the position of the external ground electrode pad 289 may be provided within the extending range of the wiring layer 293. Further, similar to the example of FIGS. 3A and 3B, electromagnetic coupling between the signal pad 241 at the input 201 and the signal pad 244 at the output 202 via the side wall 270 can be suppressed to ensure stable SAW propagation characteristics of the electronic element 200j.

Figure 17:
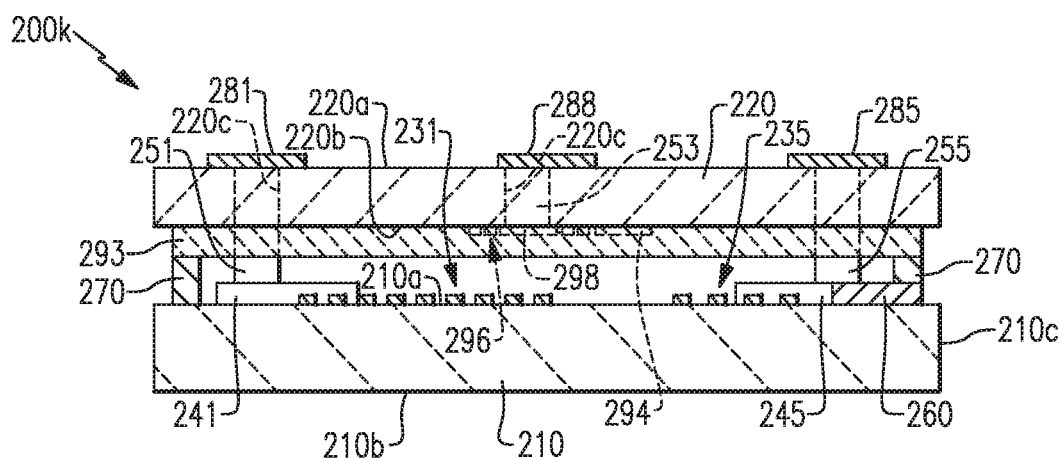
FIG. 17 is a cross-sectional view showing the configurations of another example of an electronic element according to aspects of the present invention.

FIG. 17 illustrates another example of an electronic element 200k according to certain aspects. This example is similar to the example of FIG. 16, but is different in that an additional circuit 298 is further formed in the wiring layer 293 disposed on the bottom surface 220b of the sealing substrate 220.

As shown in FIG. 17, in this example, the wiring layer 293 is disposed in contact with the bottom surface 220b of the sealing substrate 220 and is interposed between the side wall 270 disposed on the top surface 210a of the element substrate 210 and the bottom surface 220b of the sealing substrate 220. Further, an external signal electrode pad 288 is disposed on the top surface 220a of the sealing substrate 220 and a columnar signal electrode 253 is connected to the external signal electrode pad 288 and passes through a through-hole 220c of the sealing substrate 220 to be connected to another signal electrode pad 294 formed in the wiring layer 293. Still another signal electrode pad 296 is formed in the wiring layer 293. An additional circuit 298 is formed between the signal electrode pads 294 and 296.

Figure 18A:
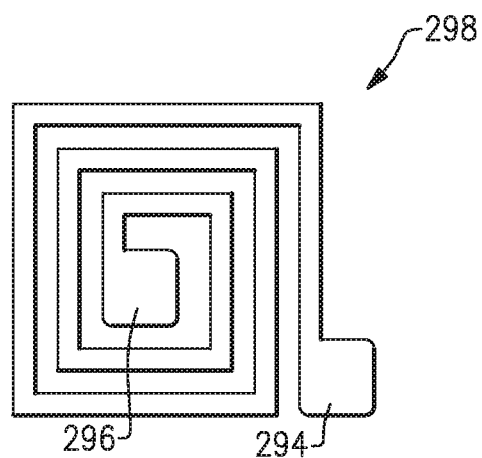
FIGS. 18A-C are diagrams showing examples of an additional circuit that can be included in the electronic element of FIG. 17 according to aspects of the present invention.
Figure 18B:
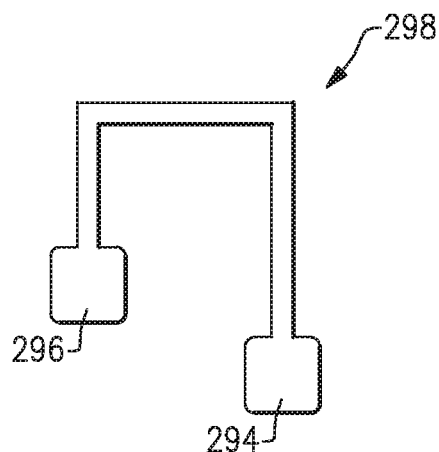
Figure 18C:
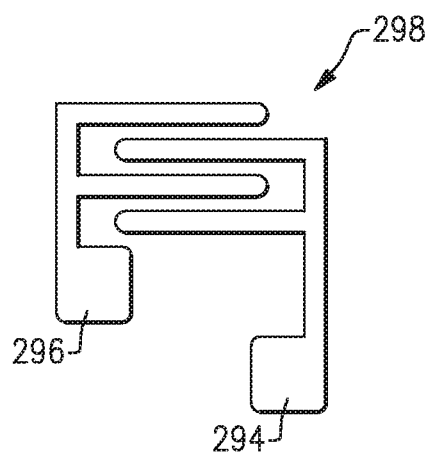

FIGS. 18A, 18B and 18C show examples of the additional circuit 298. The additional circuit 298 may be formed by one or more lead wires connecting the signal electrode pads 294 and 296. For example, the additional circuit 298 may be an inductor having a spiral shape as shown in FIG. 18A, may be an inductor having a meandering shape as shown in FIG. 18B, or may be a capacitor formed by lead wires opposed to each other as shown in FIG. 18C. Further, the additional circuit 298 is not limited to the examples shown in FIGS. 18A-C and may form another component. It is to be appreciated that although the additional circuit 298 is disposed in the wiring layer 293 in example shown in FIG. 17, the additional circuit 298 may be formed on the top surface 210a of the element substrate 210.

Because of the presence of the wiring layer 293, the electronic element 200k may provide design flexibility in the position of the external signal electrode pad 288 within the extending range of the wiring layer 293. Further, attenuation characteristics and the like of the electronic circuit can be adjusted by disposing the additional circuit 298 in the wiring layer 293. Still further, similar to the example of FIGS. 3A and 3B, electromagnetic coupling between the signal pad 241 at the input 201 and the signal pad 244 at the output 202 via the side wall 270 can be suppressed to ensure stable SAW propagation characteristics of the electronic element 200k.

Figure 19:
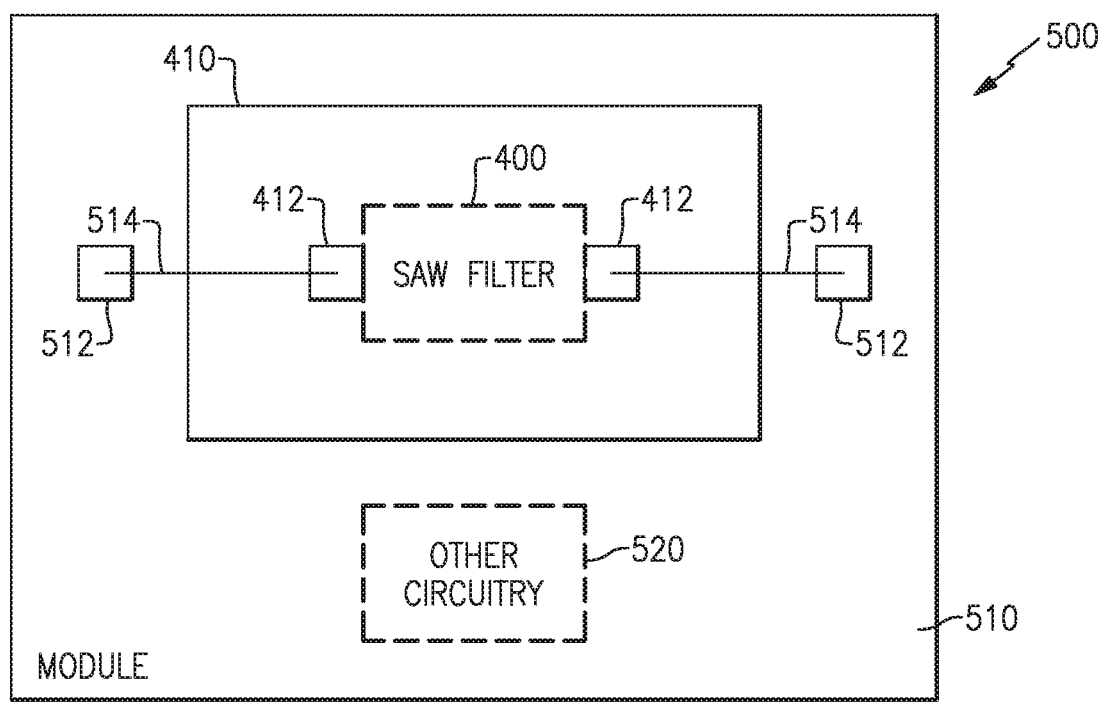
FIG. 19 is a block diagram of one example of a filter module including an example of the electronic element according to aspects of the present invention.

Various examples and embodiments of the electronic element 200, and its variations 200a-k, may be incorporated into and packaged as a module that may ultimately be used in an electronic device, such as a wireless communications device, for example. FIG. 19 is a block diagram illustrating one example of a filter module 500 including a SAW filter 400, such as that shown in FIG. 4, for example. The SAW filter 400 may be implemented on one or more die(s) 410 including one or more connection pads 412. For example, the SAW filter 400 may include a connection pad 412 that corresponds to the input 201 of the SAW filter and another connection pad 412 that corresponds to the output 202 of the SAW filter. The packaged module 500 includes a packaging substrate 510 that is configured to receive a plurality of components, including the die 410. A plurality of connection pads 512 can be disposed on the packaging substrate 510, and the various connection pads 412 of the SAW filter die 410 can be connected to the connection pads 512 on the packaging substrate 510 via electrical connectors 514, which can be solder bumps or wirebonds, for example, to allow for passing of various signals to and from the SAW filter 400. The module 500 may optionally further include other circuitry die 520, such as, for example one or more additional filter(s), amplifiers, pre-filters, modulators, demodulators, down converters, and the like, as would be known to one of skill in the art of semiconductor fabrication in view of the disclosure herein. In some embodiments, the module 500 can also include one or more packaging structures to, for example, provide protection and facilitate easier handling of the module 500. Such a packaging structure can include an overmold formed over the packaging substrate 320 and dimensioned to substantially encapsulate the various circuits and components thereon.

As discussed above, various examples and embodiments of the SAW filter 400 can be used in a wide variety of electronic devices. For example, the SAW filter 400 can be used in an antenna duplexer, which itself can be incorporated into a variety of electronic devices, such as RF front-end modules and communication devices.

Figure 20:
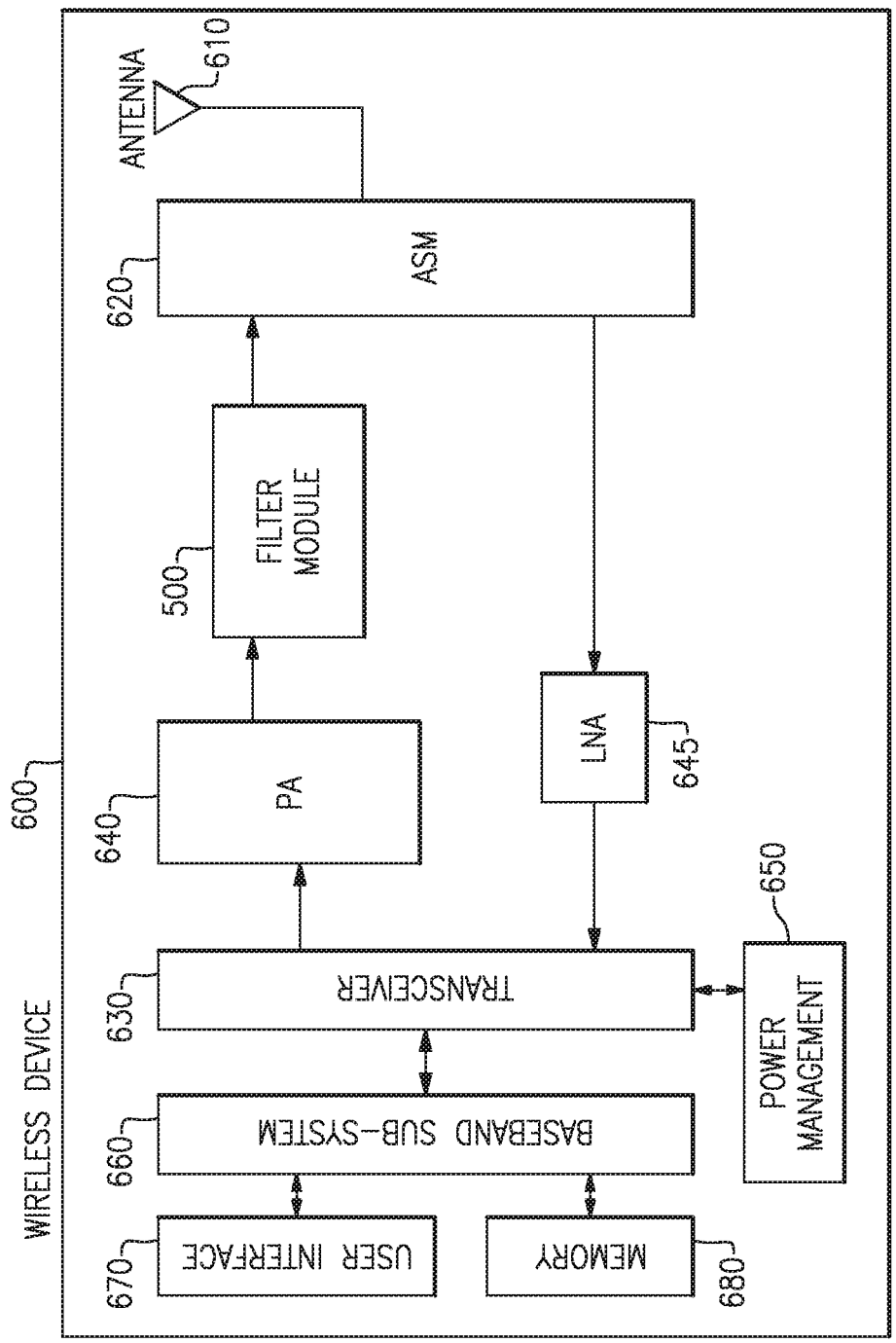
FIG. 20 is a block diagram of one example of a wireless device including a SAW filter module according to aspects of the present invention.

FIG. 20 is a block diagram of one example of a wireless device 600 including a filter module 500. The wireless device 600 can be a cellular phone, smart phone, tablet, modem, communication network or any other portable or non-portable device configured for voice or data communication. The wireless device 600 can receive and transmit signals from an antenna 610. The antenna 610 is coupled to an antenna switch module 620 that can enable switching between a transmit mode and a receive mode, for example, or between different frequency bands within the transmit mode or receive mode, for example. The wireless device 600 further includes a transceiver 630 that is configured to generate signals for transmission and/or to process received signals. Signals generated for transmission are received by a power amplifier (PA) 640, which amplifies the generated signals from the transceiver 630. Received signals are amplified by a low noise amplifier (LNA) 645 and then provided to the transceiver 630. As is also shown in FIG. 20, the antenna 610 both receives signals that are provided to the transceiver 630 via the antenna switch module 620 and the LNA 645 and also transmits signals from the wireless device 600 via the transceiver 630, the PA 640, and the antenna switch module 620. However, in other examples multiple antennas can be used.

The power amplifier 640 can be used to amplify a wide variety of RF or other frequency-band transmission signals. For example, the power amplifier 640 can receive an enable signal that can be used to pulse the output of the power amplifier to aid in transmitting a wireless local area network (WLAN) signal or any other suitable pulsed signal. The power amplifier 640 can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. In certain embodiments, the power amplifier 640 and associated components including switches and the like can be fabricated on GaAs substrates using, for example, pHEMT or BiFET transistors, or on a Silicon substrate using CMOS transistors.

In the example shown in FIG. 20, the filter module 500 is shown in the transmit path positioned between the power amplifier 640 and the antenna switch module 620. However, a variety of other configurations can be implemented. For example, the wireless device 600 can include one or more filter modules 500 in the transmit path or the receive path. Further, the filter module(s) 500 can be positioned before or after amplifiers or switches in either path.

The wireless device 600 of FIG. 20 further includes a power management sub-system 650 that is connected to the transceiver 630 and manages the power for the operation of the wireless device 600. The power management system 650 can also control the operation of a baseband sub-system 660 and various other components of the wireless device 600. The power management system 650 can include, or can be connected to, a battery (not shown) that supplies power for the various components of the wireless device 600.

In certain embodiments, the baseband sub-system 660 is connected to a user interface 670 to facilitate various input and output of voice and/or data provided to and received from the user. The baseband sub-system 660 can also be connected to memory 680 that is configured to store data and/or instructions to facilitate the operation of the wireless device, and/or to provide storage of information for the user.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. It is to be appreciated that embodiments discussed herein are not limited in application to the details of construction and the arrangement of components set forth in the foregoing description. The concepts and technology disclosed herein are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment. Accordingly, the foregoing description is by way of example only, and the scope of the invention should be determined from proper construction of the appended claims, and their equivalents.

What is claimed is:

1. An electronic filter comprising:
   a piezoelectric substrate having a top surface, a bottom surface, and a side surface;
   a filter circuit including a plurality of surface acoustic wave (SAW) resonators formed on the top surface of the piezoelectric substrate;
   a sealing substrate having a top surface and a bottom surface;
   an electrically conductive side wall formed to define a cavity between the top surface of the piezoelectric substrate and the bottom surface of the sealing substrate, the side wall enclosing a periphery of the filter circuit and being connected to a ground potential of the filter circuit; and
   a conductive shielding layer disposed to cover the side surface of the piezoelectric substrate, the bottom surface of the piezoelectric substrate, and the side wall.

2. An electronic filter comprising:
   a piezoelectric substrate having a top surface, a bottom surface, and a side surface;
   a filter circuit including a plurality of surface acoustic wave (SAW) resonators formed on the top surface of the piezoelectric substrate;
   a sealing substrate having a top surface and a bottom surface;
   an electrically conductive side wall formed to define a cavity between the top surface of the piezoelectric substrate and the bottom surface of the sealing substrate, the side wall enclosing a periphery of the filter circuit and being connected to a ground potential of the filter circuit; and
   a ground pad that is connected to the side wall and not connected to any of the plurality of resonators.

3. The electronic filter of claim 2 further comprising a conductive shielding layer disposed on the top surface of the piezoelectric substrate to cover at least one of the plurality of resonators.

4. The electronic filter of claim 2 wherein the filter circuit includes a first signal pad corresponding to an input of the filter circuit and a second signal pad corresponding to an output of the filter circuit.

5. The electronic filter of claim 4 wherein the plurality of resonators form a ladder-type filter including a plurality of series resonators connected in series between the first signal pad and the second signal pad and a plurality of parallel resonators connected in parallel between the plurality of series resonators and the ground potential.

6. The electronic filter of claim 5 wherein the filter circuit further includes a plurality of ground pads connected to the plurality of parallel resonators.

7. The electronic filter of claim 6 further comprising:
   a plurality of external signal electrode pads disposed on the top surface of the sealing substrate, each of the plurality of external signal electrode pads being connected to one of the first signal pad and a second signal pad via a respective first columnar electrode; and
   a plurality of external ground electrode pads disposed on the top surface of the sealing substrate, each of the plurality of external ground electrode pads being connected to each of the plurality of ground pads via a respective second columnar electrode.

8. The electronic filter of claim 7 further comprising a partition wall disposed between each respective second columnar electrode and the side wall.

9. The electronic filter of claim 5 wherein the side wall includes a protrusion projecting toward the filter circuit.

10. The electronic filter of claim 9 wherein the protrusion forms a partition wall between one of the plurality of series resonators and one of the plurality of parallel resonators.

11. The electronic filter of claim 6 wherein at least one of the plurality of ground pads is connected to the side wall.

12. The electronic filter of claim 11 further comprising a wiring layer disposed on the bottom surface of the sealing substrate, the side wall extending between the top surface of the piezoelectric substrate and the wiring layer.

13. The electronic filter of claim 12 further comprising an external ground electrode pad disposed on the top surface of the sealing substrate and connected to the wiring layer.

14. The electronic filter of claim 13 wherein the wiring layer includes an additional circuit including at least one of an inductor and a capacitor.

15. The electronic filter of claim 14 wherein the additional circuit includes the inductor, the inductor being formed by a lead wire having a spiral shape or a meandering shape.

16. The electronic filter of claim 15 wherein the additional circuit includes the capacitor, the capacitor being formed by lead wires positioned opposing one other.

17. The electronic filter of claim 12 further comprising a plurality of electrode pads disposed on the top surface of the sealing substrate and connected to the plurality of ground pads via a respective one of a plurality of columnar electrodes, at least two columnar electrodes of the plurality of columnar electrodes being connected to each other by the wiring layer.

18. The electronic filter of claim 2 further comprising a conductive shielding layer disposed to cover the side surface of the piezoelectric substrate and the side wall.

19. The electronic filter of claim 18 wherein the conductive shielding layer is further disposed to cover the bottom surface of the piezoelectric substrate.

20. A filter device comprising:
    a piezoelectric substrate having a top surface, a bottom surface, and a side surface;
    a pair of filter circuits formed on the top surface of the piezoelectric substrate and including a plurality of resonators;
    a sealing substrate having a bottom surface;
    an electrically conductive side wall disposed to define a cavity between the top surface of the piezoelectric substrate and the bottom surface of the sealing substrate, the side wall enclosing a periphery of the pair of filter circuits and being electrically connected to a ground potential of the pair of filter circuits; and
    a conductive shielding layer disposed to cover the side surface of the piezoelectric substrate, the bottom surface of the piezoelectric substrate, and the side wall.

21. The filter device of claim 20 wherein the pair of filter circuits includes a first filter circuit and a second filter circuit, and wherein the side wall includes a protrusion projecting toward a connection between the first and second filter circuits, the protrusion forming a partition wall between the first and second filter circuits.

22. An electronic filter comprising:
    a piezoelectric substrate having a top surface, a bottom surface, and a side surface;
    a filter circuit including a plurality of surface acoustic wave (SAW) resonators formed on the top surface of the piezoelectric substrate;
    a sealing substrate having a top surface and a bottom surface;
    an electrically conductive side wall formed to define a cavity between the top surface of the piezoelectric substrate and the bottom surface of the sealing substrate, the side wall enclosing a periphery of the filter circuit and being connected to a ground potential of the filter circuit; and a wiring layer disposed on the bottom surface of the sealing substrate, the side wall extending between the top surface of the piezoelectric substrate and the wiring layer, the wiring layer including an additional circuit having at least one of an inductor and a capacitor.

* * * * *

UNITED STATES PATENT AND TRADEMARK OFFICE
CERTIFICATE OF CORRECTION

| | | |
|---|---|---|
| PATENT NO. | : 10,778,183 B2 | Page 1 of 1 |
| APPLICATION NO. | : 15/651216 | |
| DATED | : September 15, 2020 | |
| INVENTOR(S) | : Yoshiaki Ando et al. | |

It is certified that error appears in the above-identified patent and that said Letters Patent is hereby corrected as shown below:

On the Title Page

(72) Inventors: delete "Yoshiaki Ando, Yokosuka (JP)" and insert -- Yoshiaki Ando, Yokosuka-Shi (JP) --

Signed and Sealed this
Twentieth Day of October, 2020

Andrei Iancu
*Director of the United States Patent and Trademark Office*